(12) United States Patent
Takahashi

(10) Patent No.: US 8,792,034 B2
(45) Date of Patent: Jul. 29, 2014

(54) SOLID-STATE IMAGING DEVICE WITH CHARGE TRANSFER TRANSISTOR ON DIFFERENT SUBSTRATES

(75) Inventor: Hiroshi Takahashi, Kanagawa (JP)

(73) Assignee: Sony Corporation (JP)

( * ) Notice: Subject to any disclaimer, the term of this patent is extended or adjusted under 35 U.S.C. 154(b) by 415 days.

(21) Appl. No.: 12/720,855

(22) Filed: Mar. 10, 2010

(65) Prior Publication Data

US 2010/0238334 A1 Sep. 23, 2010

(30) Foreign Application Priority Data

Mar. 17, 2009 (JP) .................................. 2009-064956

(51) Int. Cl.
*H04N 3/14* (2006.01)
*H04N 5/335* (2011.01)

(52) U.S. Cl.
USPC ........... 348/305; 348/294; 348/297; 348/299; 348/302; 348/308; 438/57; 250/214.1; 257/291; 257/292; 257/432

(58) Field of Classification Search
CPC .................................................... H04N 3/1512
USPC .................................................. 348/300, 305
See application file for complete search history.

(56) References Cited

U.S. PATENT DOCUMENTS

| | | | | |
|---|---|---|---|---|
| 6,204,524 | B1 * | 3/2001 | Rhodes .......................... | 257/222 |
| 7,102,180 | B2 * | 9/2006 | Rhodes et al. ................. | 257/222 |
| 7,965,329 | B2 * | 6/2011 | McCarten et al. ............. | 348/308 |
| 2002/0192919 | A1 * | 12/2002 | Bothra ........................... | 438/381 |
| 2005/0110884 | A1 * | 5/2005 | Altice et al. ................... | 348/302 |
| 2006/0146233 | A1 * | 7/2006 | Park ............................... | 349/95 |
| 2006/0187330 | A1 * | 8/2006 | Takayanagi et al. .......... | 348/308 |
| 2006/0226423 | A1 * | 10/2006 | Yamasaki ....................... | 257/59 |
| 2008/0083939 | A1 * | 4/2008 | Guidash ......................... | 257/292 |
| 2008/0210982 | A1 * | 9/2008 | Han ................................ | 257/225 |
| 2008/0265296 | A1 * | 10/2008 | Uya ................................ | 257/292 |
| 2009/0224345 | A1 * | 9/2009 | Lee et al. ....................... | 257/432 |
| 2010/0019130 | A1 * | 1/2010 | Lee ................................. | 250/208.1 |
| 2013/0068929 | A1 * | 3/2013 | Solhusvik et al. ............. | 250/208.1 |

FOREIGN PATENT DOCUMENTS

| | | | |
|---|---|---|---|
| JP | 63142663 A * | 6/1988 | ............. H01L 25/08 |
| JP | 2001-077341 | 3/2001 | |
| JP | 2002-314061 | 10/2002 | |
| JP | 2003-101006 | 4/2003 | |

(Continued)

OTHER PUBLICATIONS

Watabe et al.; CMOS Image Sensor Overlaid With Harp Photo-Conversion Film; Pub Year 2000; IEEE; 0-7803-6698-0/00; pp. 89-92.*

(Continued)

*Primary Examiner* — Roberto Velez
*Assistant Examiner* — Cynthia Segura
(74) *Attorney, Agent, or Firm* — Sheridan Ross P.C.

(57) ABSTRACT

A solid-state imaging device includes a plurality of pixels, each of which includes a photoelectric converter section formed on a first substrate to generate and accumulate signal charges corresponding to incident light, a charge accumulation capacitor section formed on the first substrate or a second substrate to temporarily hold the signal charges transferred from the photoelectric converter section, and a plurality of MOS transistors formed on the second substrate to transfer the signal charges accumulated in the charge accumulation capacitor section, connection electrodes formed on the first substrate, and connection electrodes formed on the second substrate and electrically connected to the connection electrodes formed on the first substrate.

12 Claims, 13 Drawing Sheets

(56) References Cited

FOREIGN PATENT DOCUMENTS

| JP | 2004-111590 | 4/2004 |
| JP | 2004-172377 | 6/2004 |
| JP | 2006-038657 | 2/2006 |
| JP | 2006-217410 | 8/2006 |
| JP | 2008-071961 | 3/2008 |
| JP | 2008-277511 | 11/2008 |
| WO | WO 2007/105478 | 9/2007 |
| WO | WO 2007/148891 | 12/2007 |
| WO | WO 2007148891 A1 * 12/2007 | ............ H01L 27/146 |

OTHER PUBLICATIONS

Japanese Office Action issued on Mar. 15, 2011 in connection with counterpart JP Application No. 2009-064956.

European Search Report for European Patent Application No. 10002084.1 dated Oct. 8, 2013, 3 pages.

* cited by examiner

SOLID-STATE IMAGING DEVICE WITH CHARGE TRANSFER TRANSISTOR ON DIFFERENT SUBSTRATES

BACKGROUND OF THE INVENTION

1. Field of the Invention

The present invention relates to a solid-state imaging device, and in particular to a CMOS solid-state imaging device equipped with a global shutter function, as well as to a method of manufacturing the solid-state imaging device. The present invention also relates to a method of driving the solid-state imaging device, as well as to an electronic apparatus in which the solid-state imaging device is employed.

2. Description of the Related Art

In recent years, video cameras and electronic still cameras have been widespread. In these cameras, a charge coupled device (CCD) or amplified solid-state imaging device is employed. In the amplified solid-state imaging device, signal charges generated by and accumulated in the photoelectric converter section in a light receiving pixel are transferred to an amplifier provided in this pixel and an amplified signal is output from the pixel. A plurality of such pixels are arranged in a matrix in the amplified solid-state imaging device. Examples of amplified solid-state imaging devices include solid-state imaging devices employing junction field-effect transistors or complementary metal oxide semiconductor (CMOS) transistors in amplification sections.

In a typical CMOS solid-state imaging device in the past, the signal charges generated by and accumulated in the photoelectric converter sections in the pixels arranged in a two-dimensional matrix are sequentially read out row by row. In this type of solid-state imaging devices, exposure timing differs from pixel to pixel because the exposure timing in each pixel is determined by the start and end of readout of the signal charges in the photoelectric converter section in the pixel. Inherently, this type of CMOS solid-state imaging devices have a problem that a distorted image of a subject is taken when the subject is fast moving.

To address the above problem, in recent years there has been proposed a simultaneous imaging function (global shutter function) for simultaneous accumulation of signal charges, and there is an increased application of CMOS solid-state imaging devices equipped with the global shutter function.

The CMOS solid-state imaging device equipped with the global shutter function generally uses a light shielded accumulation capacitor section to accumulate the signal charges generated by the photoelectric converter section until they are read out (see Japanese Unexamined Patent Application Publication No. 2004-111590, for example). In such CMOS solid-state imaging devices in the past, after all pixels are simultaneously exposed to light, the signal charges generated by the photoelectric converter sections are transferred to the accumulation capacitor sections simultaneously in all pixels, accumulated there, and sequentially converted into pixel signals at a predetermined readout timing.

SUMMARY OF THE INVENTION

A typical CMOS solid-state imaging device equipped with the global shutter function in the past inherently uses an increased chip area, because photoelectric converter sections and accumulation capacitor sections are formed on a same substrate surface. In the solid-state imaging device market, in which pixels are being refined and increased in number year after year, an increased cost due to the increased chip size is becoming a serious disadvantage. Another problem with this type of CMOS solid-state imaging devices having the photoelectric converter sections and accumulation capacitor sections formed on the same substrate surface is a limited light receiving area of the photoelectric converter section because the accumulation capacitor sections occupy a significant area on the substrate.

It is desirable to provide a solid-state imaging device that reduces the chip size and thus reduces the cost of a chip and an electronic apparatus which is reduced in size by employing the solid-state imaging device.

According to an embodiment of the present invention, a solid-state imaging device includes a first substrate on which photoelectric converter sections are formed and a second substrate on which a plurality of MOS transistors are formed, the first and second substrates being bonded to each other. Charge accumulation capacitor sections are formed on the first or second substrate.

The photoelectric converter section is a region in which signal charges corresponding to incident light are generated and accumulated. The charge accumulation capacitor section is a region in which the signal charges transferred from the photoelectric converter section are accumulated. The plurality of MOS transistors are used to transfer the signal charges accumulated in the charge accumulation capacitor section. Each pixel includes the photoelectric converter section, the charge accumulation capacitor section, and the plurality of MOS transistors. Connection electrodes are formed on the first and second substrates to electrically connect these substrates to each other.

In the solid-state imaging device according to the embodiment of the present invention, the first and second substrates are integrated by the electrical connection provided by the connection electrodes. Since the MOS transistors are formed on the second substrate, a large area can be reserved for the photoelectric converter sections formed on the first substrate.

According to another embodiment of the present invention, a method of manufacturing the solid-state imaging device includes the steps of forming on the first substrate photoelectric converter sections for generating and accumulating signal charges corresponding to incident light and forming connection electrodes exposed on the surface of the substrate. The method also includes the step of forming on the first or second substrate charge accumulation capacitor sections for accumulating the signal charges transferred from the photoelectric converter sections. The method further includes the steps of forming on the second substrate a plurality of MOS transistors for sequentially transferring the signal charges accumulated in the charge accumulation capacitor sections and forming connection electrodes exposed on the surface of the substrate. The method further includes the step of bonding the first substrate to the light incident side of the second substrate to electrically connect the connection electrodes exposed on the first and second substrate surfaces to each other.

According to another embodiment of the present invention, a method of driving the solid-state imaging device includes the steps of initiating accumulation of signal charges in the photoelectric converter sections simultaneously in all pixels in the solid-state imaging device according to the above embodiment of the present invention, and transferring the signal charges accumulated in the photoelectric converter sections to the charge accumulation capacitor sections simultaneously in all pixels. It also includes the step of sequentially transferring, for each pixel, the signal charges accumulated in the charge accumulation capacitor sections through the MOS transistors.

According to another embodiment of the present invention, an electronic apparatus includes the solid-state imaging device according to the above embodiment of the present invention and a signal processing circuit for processing the signals output from the solid-state imaging device.

An embodiment of the present invention enables a reduction of the chip size on which the solid-state imaging device is formed and a cost reduction of a chip. Another embodiment of the present invention also enables a reduction in size of an electronic apparatus by employing the solid-state imaging device according to the embodiment of the present invention.

DESCRIPTION OF THE PREFERRED EMBODIMENTS

Figure 1:
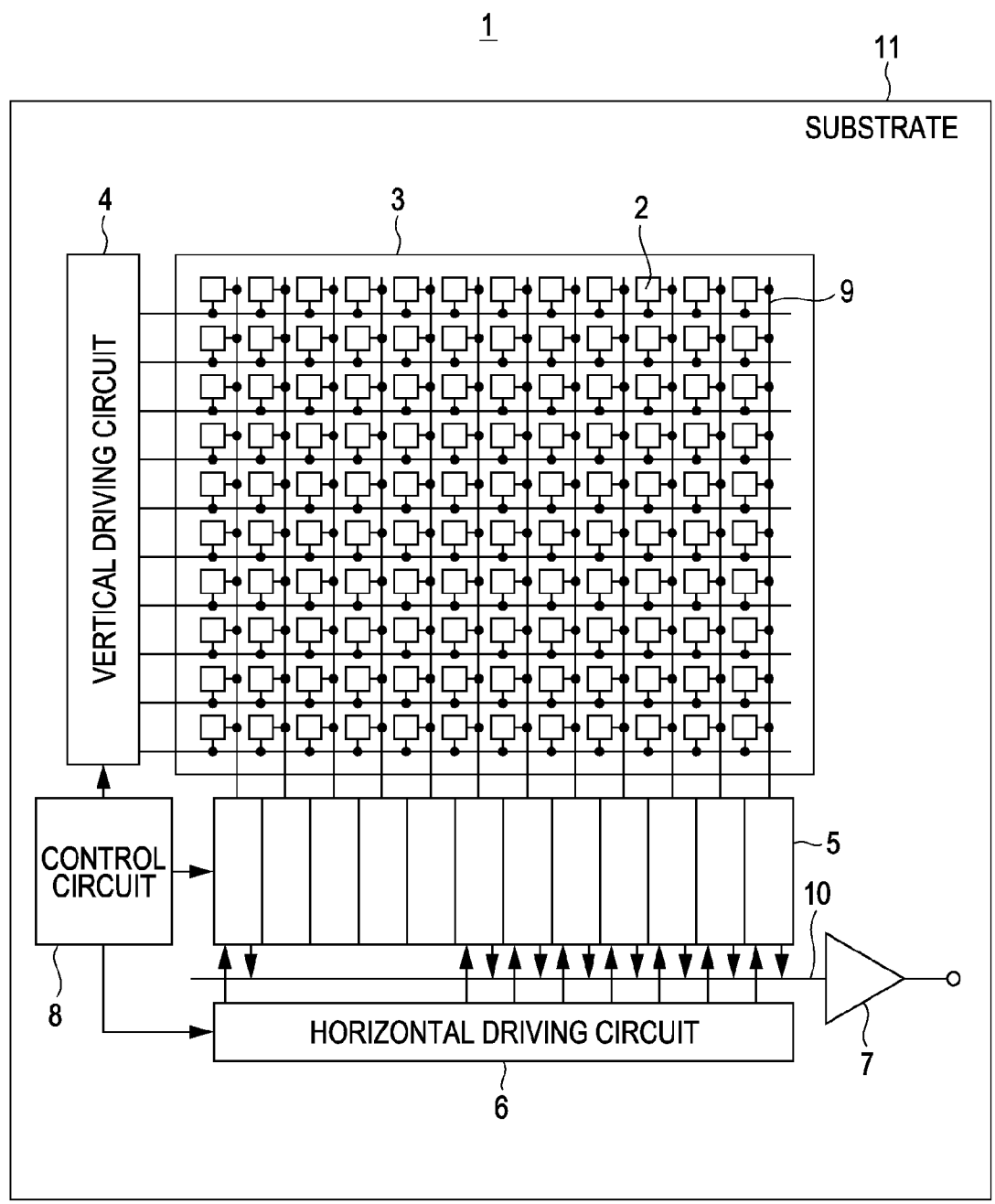
FIG. 1 schematically shows the entire structure of a solid-state imaging device according to an embodiment of the present invention.

Solid-state imaging devices, a method of manufacturing the solid-state imaging device, a method of driving the solid-state imaging device, and an exemplary electronic apparatus according to embodiments of the present invention will now be described with reference to FIGS. 1 to 13. The embodiments of the present invention will be described in the following order. It should be appreciated that the present invention is not limited to the embodiments described below.

1. Embodiment: a solid-state imaging device
1.1 Entire structure of the solid-state imaging device
1.2 Configuration of main sections
1.3 Method of manufacturing the solid-state imaging device
1.4 Circuit configuration of the solid-state imaging device
1.5 Method of driving the solid-state imaging device
2. Another embodiment: solid-state imaging device
3. Still another embodiment: electronic apparatus 1. Embodiment A Solid-State Imaging Device

[1.1 Entire Structure of the Solid-State Imaging Device]

FIG. 1 schematically shows the entire structure of a solid-state imaging device 1 according to an embodiment of the present invention.

The solid-state imaging device 1 in the present embodiment has a pixel section 3 including a plurality of pixels 2 arrayed on a silicon substrate 11, a vertical driving circuit 4, a column signal processing circuit 5, a horizontal driving circuit 6, an output circuit 7, and a control circuit 8.

The plurality of pixels 2, each including a photoelectric converter section made of a photodiode, a charge accumulation capacitor section, and a plurality of MOS transistors, are regularly arranged in a two-dimensional array on the substrate 11. The MOS transistors included in the pixel 2 may be four MOS transistors including a transfer transistor, a reset transistor, a selection transistor, and an amplification transistor, or may be three MOS transistors excluding the selection transistor.

The pixel section 3 includes a plurality of pixels 2 regularly arranged in a two-dimensional array. The pixel section 3 includes an effective pixel region and a black reference pixel region (not shown). In the effective pixel region, light is actually received, signal charges are generated by photoelectric conversion, amplified, and then read out to the column signal processing circuit 5. The black reference pixel region outputs an optical black as the reference black level. The black reference pixel region is generally formed around the periphery of the effective pixel region.

In response to vertical synchronizing signals, horizontal synchronizing signals, and a master clock, the control circuit 8 generates clock signals and control signals used as the reference signals for operation of several circuits including the vertical driving circuit 4, column signal processing circuit 5, and horizontal driving circuit 6. The clock signals, control signals, and other signals generated by the control circuit 8 are input to several circuits including the vertical driving circuit 4, column signal processing circuit 5, and horizontal driving circuit 6.

The vertical driving circuit 4 is formed from shift registers, for example, and selectively scans the pixels 2 in the pixel section 3 row by row in the vertical direction. A pixel signal corresponding to the signal charge generated in the photodiode in each pixel 2 according to the amount of received light is supplied to the column signal processing circuit 5 through a vertical signal line 9.

The column signal processing circuit 5 is provided for each column of pixels 2, for example, and performs noise elimination, signal amplification, and other signal processing, column by column, for the signals output from one row of pixels 2 according to the signals from the black reference pixel region (not shown) formed around the periphery of the effective pixel region. A horizontal selection switch (not shown) is provided between the column signal processing circuit 5 and a horizontal signal line 10.

The horizontal driving circuit 6 is made up of shift registers, for example, and sequentially outputs horizontal scanning pulses to select the column signal processing circuits 5 one by one to cause each column signal processing circuit 5 to output a pixel signal to the horizontal signal line 10.

The output circuit 7 processes the signals sequentially supplied from the column signal processing circuits 5 through the horizontal signal line 10 and outputs the processed signals.

[1.2 Configuration of Main Sections]

Figure 2:
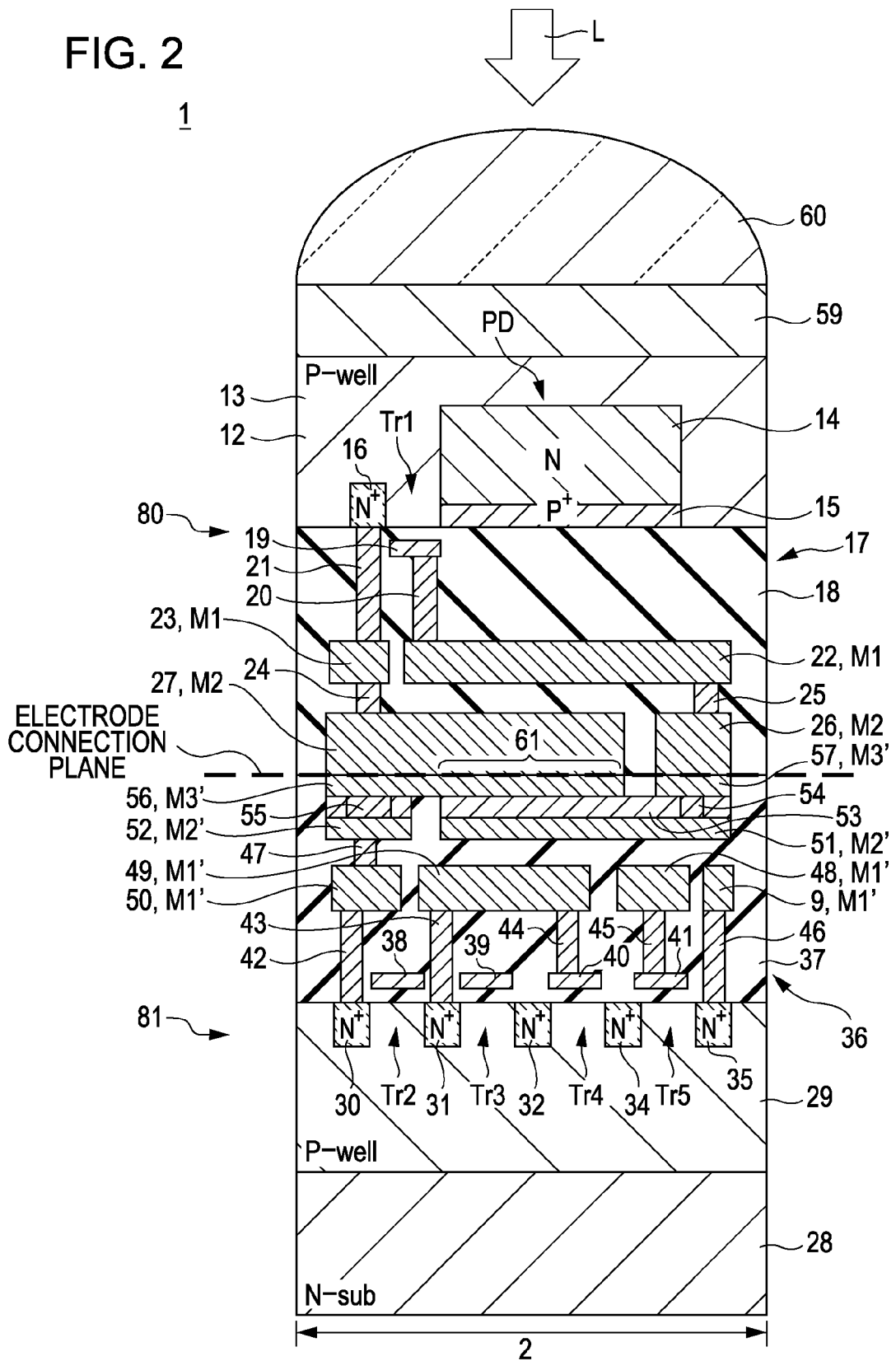
FIG. 2 schematically shows the cross section of one pixel in the solid-state imaging device according to the embodiment of the present invention.
Figure 3A:
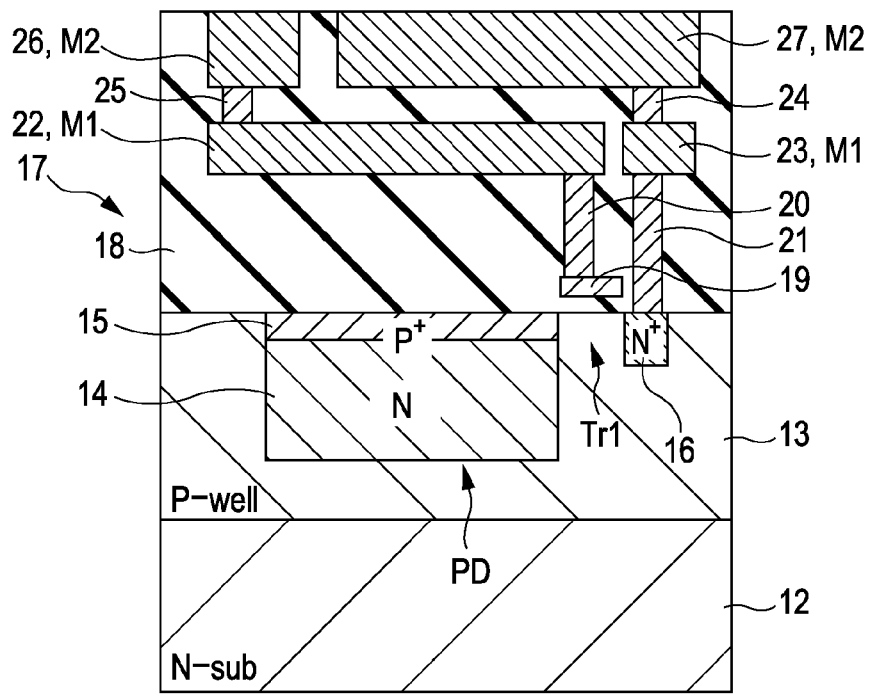
FIGS. 3A and 3B schematically show the cross sections of the partially manufactured solid-state imaging device according to the embodiment of the present invention.
Figure 3B:
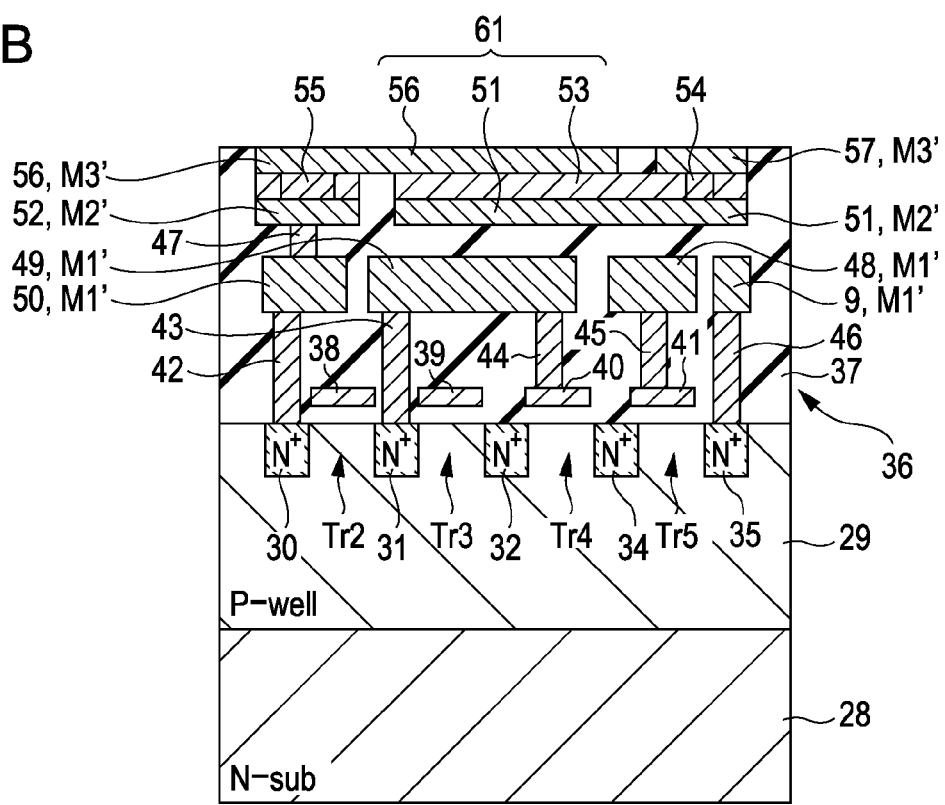

Referring now to FIGS. 2, 3A, and 3B, the schematic configuration of main sections of the solid-state imaging device 1 in the present embodiment will be described. FIG. 2 schematically shows the cross section of one pixel in the solid-state imaging device 1 according to the present embodiment. FIGS. 3A and 3B schematically show the cross sections of the solid-state imaging device 1 shown in FIG. 2 in a partially manufactured state.

As shown in FIG. 2, the solid-state imaging device 1 in the present embodiment includes a first substrate 80 on which the photoelectric converter section PD is formed, and a second substrate 81 on which a charge accumulation capacitor section 61 and a plurality of MOS transistors are formed. The first substrate 80 and the second substrate 81 are stacked and bonded together. The first substrate 80 having the photoelectric converter section PD includes a light incident surface for receiving incident light L. A color filter 59 and an on-chip lens 60 are formed on the light incident surface on the first substrate 80.

Referring now to FIGS. 3A and 3B, the structures of the first substrate 80 and second substrate 81 will be described in detail.

First, the first substrate 80 will be described.

As shown in FIG. 3A, the first substrate 80 includes a semiconductor substrate 12 on which a photoelectric converter section PD and an impurity region 16 serving as the drain of a first transfer transistor Tr1 are formed, and a multilayered interconnection layer 17 formed above the semiconductor substrate 12.

The semiconductor substrate 12 is made of an n-type silicon substrate, on which a p-type well layer 13 is formed. The p-type well layer 13 can be formed by implanting p-type dopants into the semiconductor substrate 12.

The photoelectric converter section PD includes an n-type well layer 14 formed in the p-type well layer 13 and a p$^+$-type impurity region 15 formed on the top side of the p-type well layer 13, in contact with the n-type well layer 14. The n-type well layer 14 is formed by implanting n-type dopants into a desired area of the p-type well layer 13. The p$^+$-type impurity region 15 is formed by implanting p-type dopants at high concentration into a desired area of the p-type well layer 13. In this photoelectric converter section PD, an Hole Accumulation Diode® (HAD) structure is formed by the effects of a p-n junction between the p$^+$-type impurity region 15 and the n-type well layer 14 and of a p-n junction between the n-type well layer 14 and the p-type well layer 13.

In the photoelectric converter section PD thus structured, signal charges corresponding to the amount of incident light L are generated, undergoes photoelectric conversion, and is accumulated in a depletion layer formed between the p$^+$-type impurity region 15 and the n-type well layer 14.

The impurity region 16, which is a region formed on the top side of the p-type well layer 13 at a predetermined distance from the photoelectric converter section PD, temporarily accumulates the signal charges transferred from the photoelectric converter section PD. The impurity region 16 is formed by implanting n-type dopants at a high concentration into a desired area of the p-type well layer 13.

In the present embodiment, the region between the photoelectric converter section PD and the impurity region 16 serves as the channel section of the first transfer transistor Tr1.

The multilayered interconnection layer 17 is formed on the p-type well layer 13 on the semiconductor substrate 12 in which the photoelectric converter section PD and the impurity region 16 are formed. The multilayered interconnection layer 17 includes a gate electrode 19 forming part of the first transfer transistor Tr1, a first interconnection layer M1 formed above the gate electrode 19, and a second interconnection layer M2 formed above the first interconnection layer M1. The gate electrode 19, the first interconnection layer M1, and the second interconnection layer M2 are stacked with an interlayer insulating film 18 in between.

The gate electrode 19 is formed above the channel section between the photoelectric converter section PD and the impurity region 16 formed in the p-type well layer 13 with a gate insulating film (not shown) in between.

The first interconnection layer M1 includes a first connection wire 23 and a second connection wire 22. The first connection wire 23 is connected to the impurity region 16 via a contact section 21 formed in the interlayer insulating film 18. The second connection wire 22 is connected to the gate electrode 19 via a contact section 20 formed in the interlayer insulating film 18.

The second interconnection layer M2 includes a first connection electrode 27 and a second connection electrode 26 which are exposed on the surface of the multilayered interconnection layer 17. The first connection electrode 27 is connected to the first connection wire 23 formed from the first interconnecting layer M1 via a contact section 24 formed in the interlayer insulating film 18. The second connection electrode 26 is connected to the second connection wire 22 formed from the first interconnection layer M1 via a contact section 25 formed in the interlayer insulating film 18.

On the first substrate 80 thus structured, the light incident side is located opposite to the side of the semiconductor substrate 12 in which the first connection electrode 27 and the second connection electrode 26 are formed. The semiconductor substrate 12 on the first substrate is removed to a predetermined thickness in a later process as described below.

Next, the second substrate 81 will be described.

As shown in FIG. 3B, the second substrate 81 includes a semiconductor substrate 28 on which impurity regions 30, 31, 32, 34, 35 are formed as the source/drain regions of the MOS transistors, and a multilayered interconnection layer 36 formed on the semiconductor substrate 28. The charge accumulation capacitor section 61 is formed in the multilayered interconnection layer 36. In the present embodiment, the MOS transistors formed on the second substrate 81 are a second transfer transistor Tr2, a reset transistor Tr3, an amplification transistor Tr4, and a selection transistor Tr5.

The semiconductor substrate 28 is made of an n-type silicon substrate, on which a p-type well layer 29 is formed. The p-type well layer 29 can be formed by implanting p-type dopants into the semiconductor substrate 28.

The impurity regions 30, 31, 32, 34, 35 of the second transfer transistor Tr2, reset transistor Tr3, amplification transistor Tr4, and selection transistor Tr5 are formed in desired areas on the top side of the p-type well layer 29. The impurity regions 30, 31, 32, 34, 35 are formed by implanting n-type dopants at a high concentration into desired areas of the p-type well layer 29.

The impurity region 30 serves as the source of the second transfer transistor Tr2. The impurity region 31 serves as both the drain of the second transfer transistor Tr2 and the source of the reset transistor Tr3, and is used as the floating diffusion region to which the signal charges are read out. The impurity region 32 serves as both the drain of the reset transistor Tr3 and the source of the amplification transistor Tr4. The impurity region 34 serves as both the drain of the amplification transistor Tr4 and the source of the selection transistor Tr5. The impurity region 35 serves as the drain of the selection transistor Tr5. The regions between the impurity regions 30, 31, 32, 34, 35 in the p-type well layer 29 serve as the channel sections of the MOS transistors.

The multilayered interconnection layer 36 is formed above the semiconductor substrate 28, on the p-type well layer 29 in which the impurity regions 30, 31, 32, 34, 35 are formed. The multilayered interconnection layer 36 includes gate electrodes 38, 39, 40, 41 of the MOS transistors, a first interconnection layer M1', a second interconnection layer M2', and a third interconnection layer M3', which are stacked with an interlayer insulating film 37 in between.

The gate electrodes 38, 39, 40, 41 are formed above the channel sections of the MOS transistors with a gate insulating film (not shown) in between. The gate electrode 38 formed above the p-type well layer 29 between the impurity regions 30 and 31 serves as the gate electrode 38 of the second transfer transistor Tr2. The gate electrode 39 formed above the p-type well layer 29 between the impurity regions 31 and 32 serves as the gate electrode of the reset transistor Tr3. The gate electrode 40 formed above the p-type well layer 29 between the impurity regions 32 and 34 serves as the gate electrode of the amplification transistor Tr4. The gate electrode 41 formed above the p-type well layer 29 between the impurity regions 34 and 35 serves as the gate electrode of the selection transistor Tr5.

The first interconnection layer M1' is formed above the gate electrodes 38, 39, 40, 41 with the interlayer insulating film 37 in between and includes a first connection wire 50, a second connection wire 49, a selection wire 48, and the vertical signal line 9. The first connection wire 50 is connected to the impurity region 30 serving as the source of the second transfer transistor Tr2, via a contact section 42 formed in the interlayer insulating film 37. The second connection wire 49 is connected to the impurity region 31 and the gate electrode 40 of the amplification transistor Tr4 via contact sections 43, 44 formed in the interlayer insulating film 37. The impurity region 31 serving as the floating diffusion region and the gate electrode 40 of the amplification transistor Tr4 are thus electrically connected to each other by the second connection wire 49. The selection wire 48 is connected to the gate electrode 41 of the selection transistor Tr5 via a contact section 45 formed in the interlayer insulating film 37. The gate electrode 41 of the selection transistor Tr5 is supplied with selection pulses through the selection wire 48. The vertical signal line 9 is connected to the impurity region 35 serving as the drain of the selection transistor Tr5 via a contact section 46 formed in the interlayer insulating film 37.

The second interconnection layer M2' includes a third connection wire 52 and a charge holding electrode 51. The third connection wire 52 is connected to the first connection wire 50 via a contact section 47 formed in the interlayer insulating film 37. The charge holding electrode 51 is formed over a predetermined region. The charge holding electrode 51 forms part of the charge accumulation capacitor section 61 as described below. The charge holding electrode 51 is, therefore, sized to provide a sufficient capacitance value for the charge accumulation capacitor section 61. A first transfer wire (not shown), which is formed in the multilayered interconnection layer 36 on the second substrate 81, is connected to the charge holding electrode 51 to supply a first transfer pulse thereto.

A dielectric layer 53 is formed on the charge holding electrode 51 and the third connection wire 52 in the second interconnection layer M2'. The third interconnection layer M3' is formed above the second interconnection layer M2' with the dielectric layer 53 in between. The dielectric layer 53 is thus disposed between the second interconnection layer M2' and the third interconnection layer M3'. The dielectric layer 53 may be made of tantalum oxide (TaO), hafnium oxide (HfO), aluminum oxide (AlO), or other high dielectric material.

The third interconnection layer M3' includes a first connection electrode 56 and a second connection electrode 57. The first and second connection electrodes 56, 57 are exposed on the surface of the multilayered interconnection layer 36. The first connection electrode 56 is connected to the third connection wire 52 formed from the second interconnection layer M2' via a contact section 55 formed in the dielectric layer 53 and is formed over the charge holding electrode 51 formed from the second interconnection layer M2'. The second connection electrode 57 is connected to the charge holding electrode 51 formed from the second interconnection layer M2' via a contact section 54 formed in the dielectric layer 53. In the present embodiment, the charge accumulation capacitor section 61 includes the charge holding electrode 51 and the first connection electrode 56 that is formed thereabove with the dielectric layer 53 in between.

A second transfer wire (not shown in FIG. 3B) is connected to the gate electrode 38 of the second transfer transistor Tr2 to supply a second transfer pulse thereto. A reset wire (not shown in FIG. 3B) is connected to the gate electrode 39 of the reset transistor Tr3 to supply reset pulses thereto. The second transfer wire and the reset wire are formed from desired interconnection layers in the multilayered interconnection layer 36.

In the solid-state imaging device 1 in the present embodiment, the first substrate 80 is placed on the second substrate 81, so that the first connection electrodes 56, 27 on the first substrate 80 and the second connection electrodes 57, 26 on the second substrate 81 are connected to each other. Once the first substrate 80 and the second substrate 81 are bonded together, the impurity region 16 forming part of the first transfer transistor Tr1, the charge accumulation capacitor section 61, and the impurity region 30 forming part of the second transfer transistor Tr2 are electrically connected. In the solid-state imaging device 1 in the present embodiment, once the first substrate 80 and the second substrate 81 are stacked and bonded together, the photoelectric converter section PD and the charge accumulation capacitor section 61 are vertically stacked.

In the solid-state imaging device 1 in the present embodiment, the first connection electrode 56 serves as the light shielding film for shielding the impurity region 30 serving as the source of the second transfer transistor Tr2 from light. Since the incident light onto the impurity region 30 is restricted, generation of an unnecessary signal charge is restricted and thus color mixing is reduced. Preferably, the entire region except the opening of the photoelectric converter section PD is shielded from light.

Next, a method of manufacturing the solid-state imaging device 1 according to the above embodiment including the stacked first and second substrates 80, 81 will be described below.

[1.3 Method of Manufacturing the Solid-State Imaging Device]

Figure 4A:
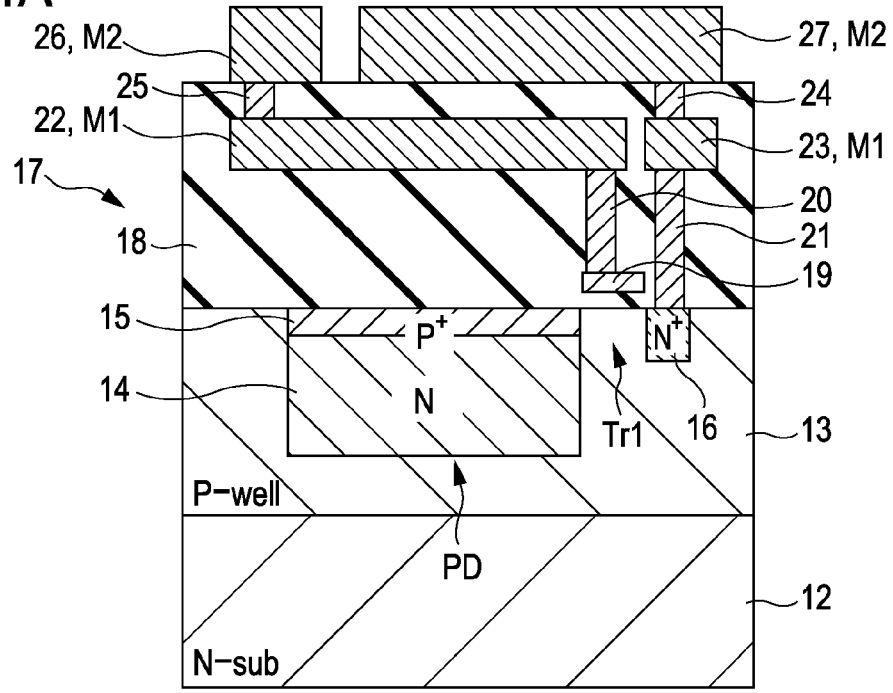
FIGS. 4A and 4B show the first stage of manufacturing first and second connection electrodes on the first and second substrates.
Figure 4B:
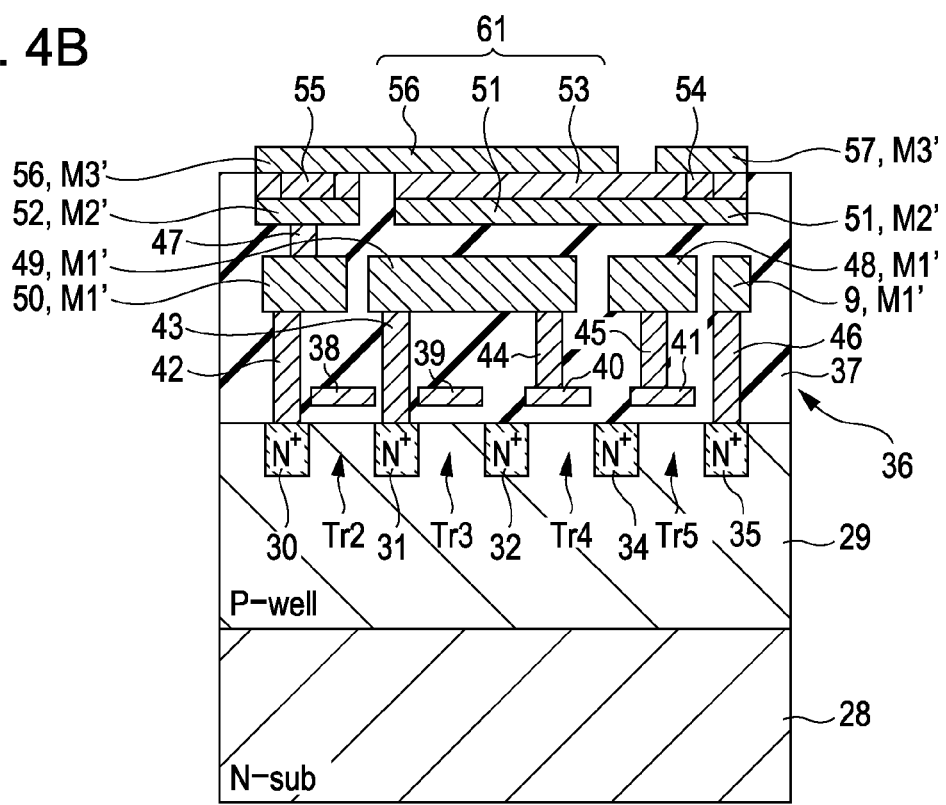
Figure 5A:
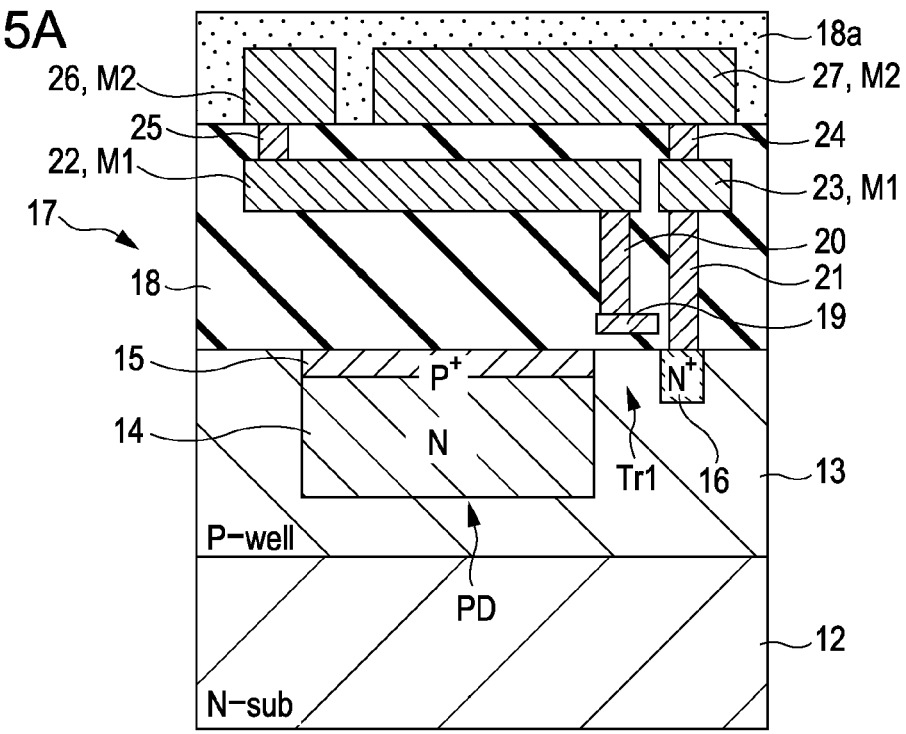
FIGS. 5A and 5B show the second stage of manufacturing the first and second connection electrodes on the first and second substrates.
Figure 5B:
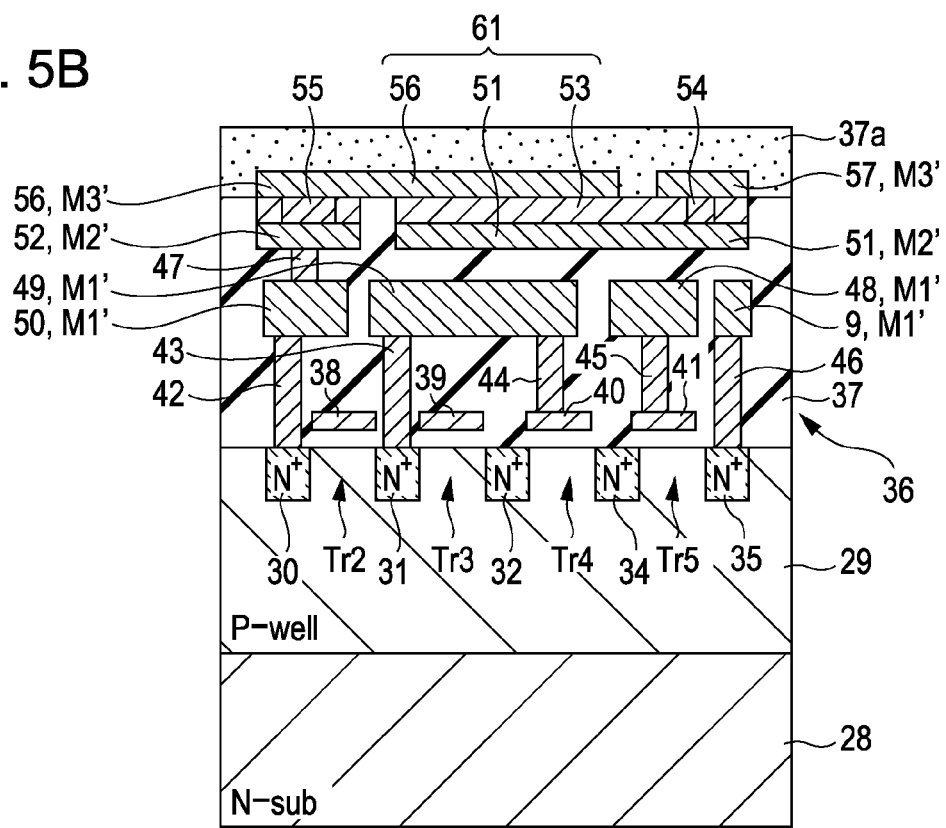
Figure 6A:
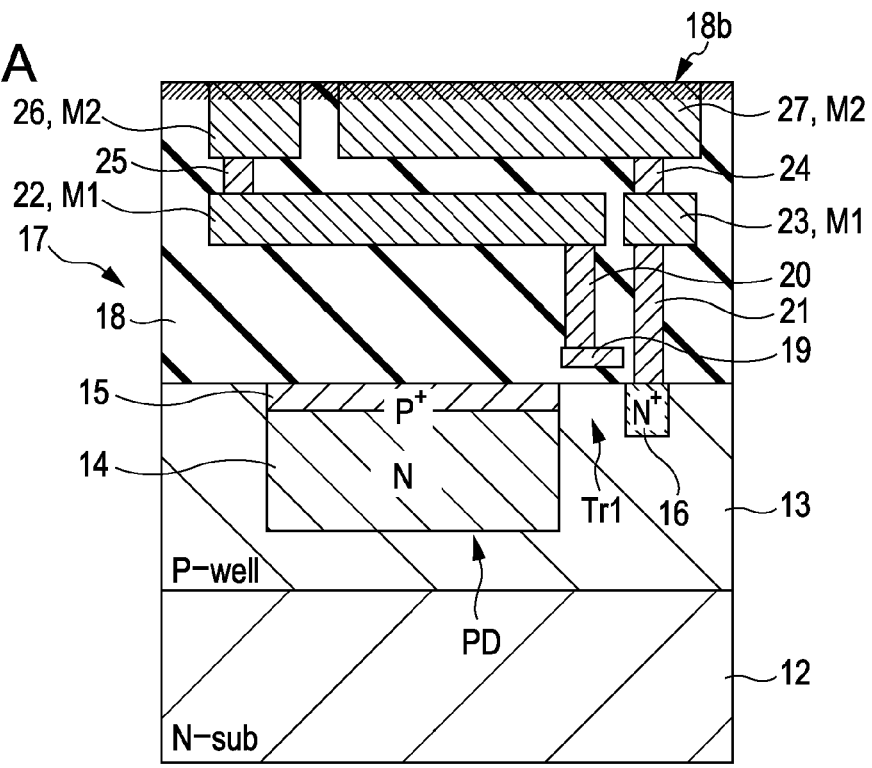
FIGS. 6A and 6B show the third stage of manufacturing the first and second connection electrodes on the first and second substrates.
Figure 6B:
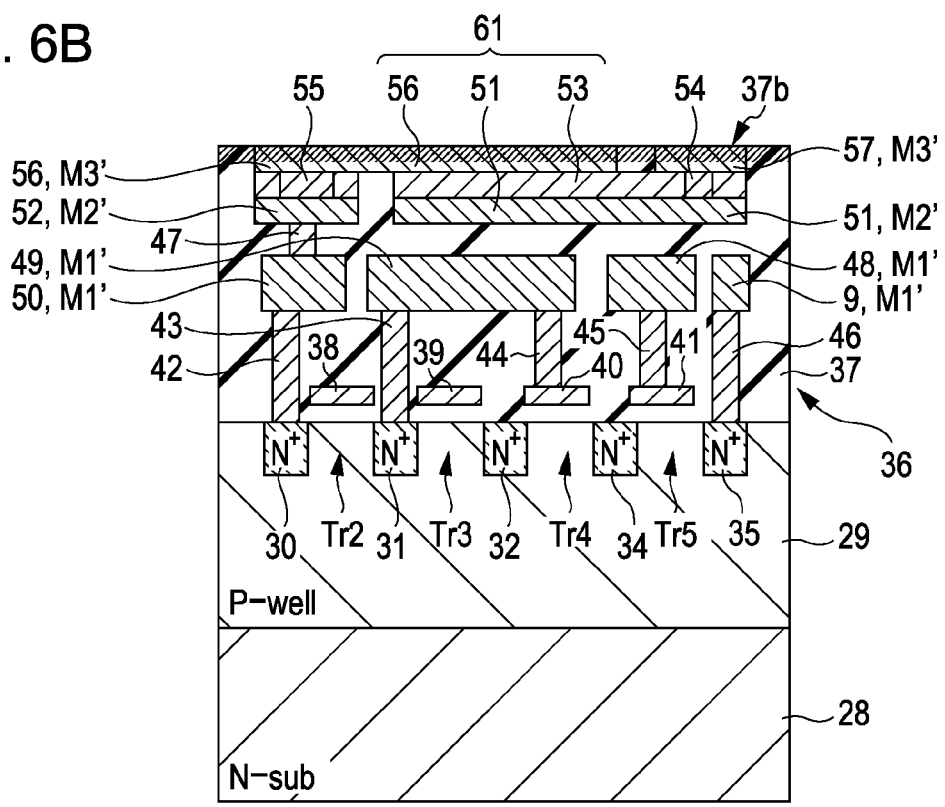
Figure 7:
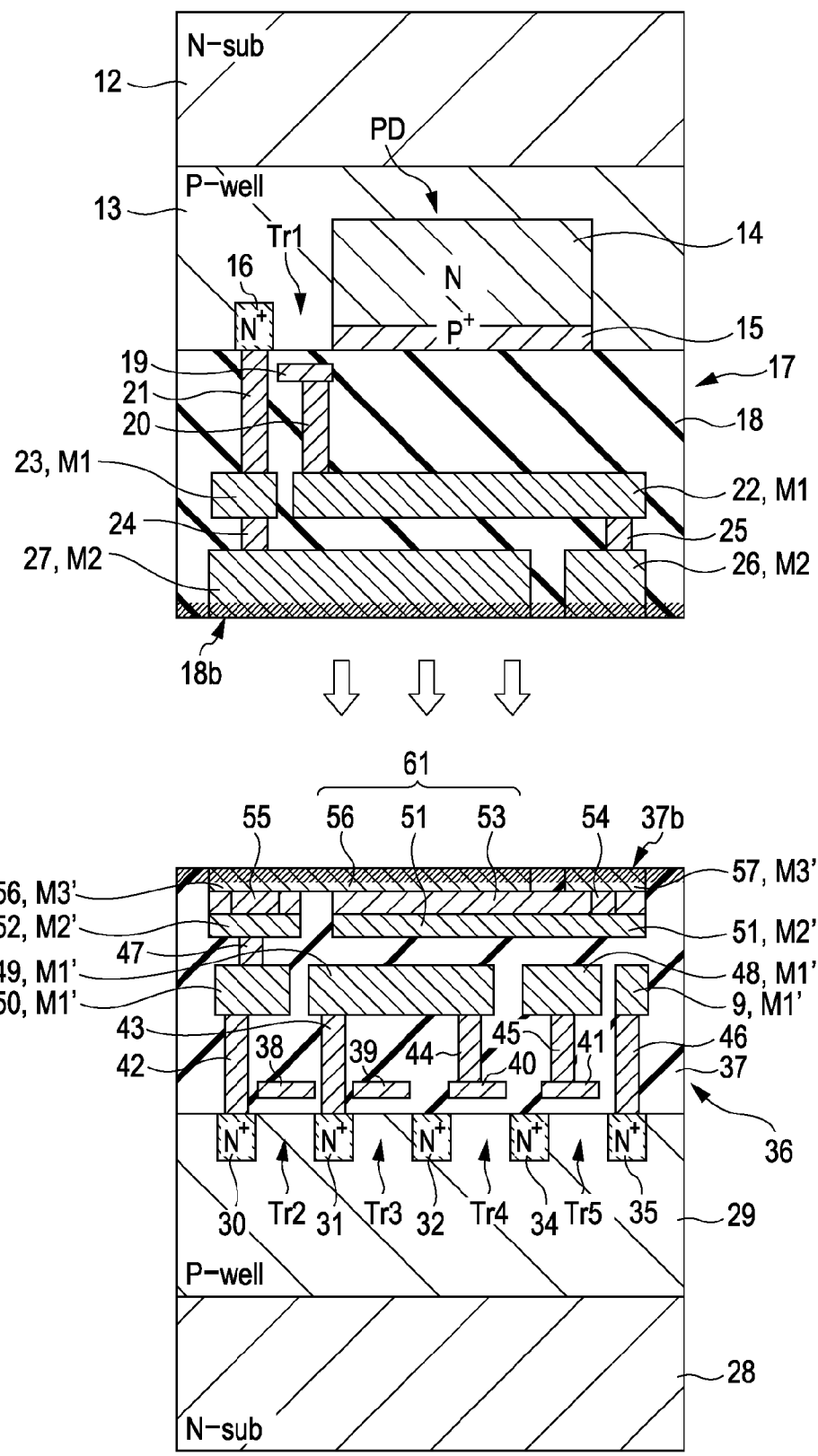
FIG. 7 shows a method of bonding the first and second connection electrodes on the first and second substrates to each other.
Figure 8:
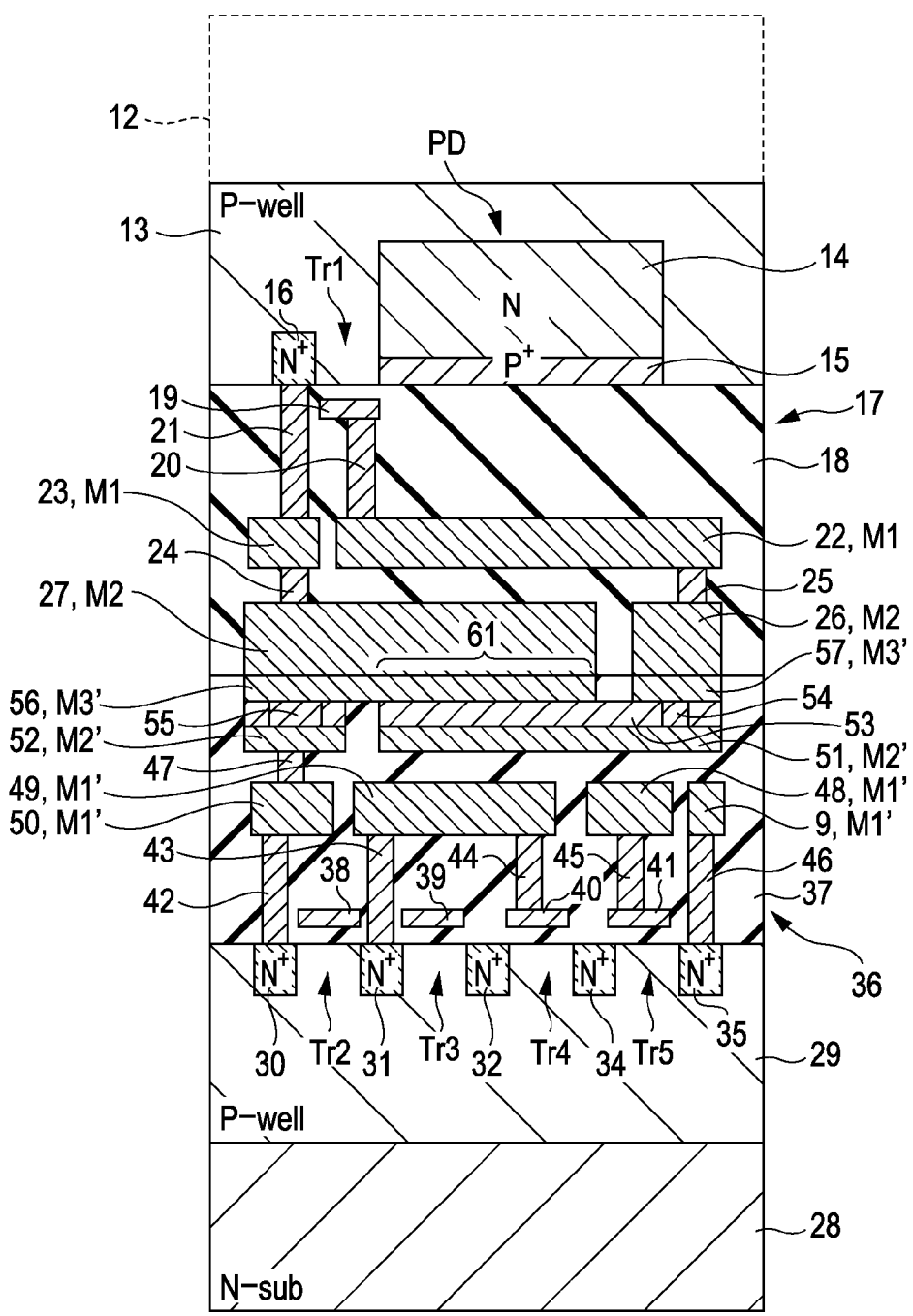
FIG. 8 shows a method of bonding the first and second connection electrodes on the first and second substrates.

FIGS. 4A, 5A, and 6A show the stages of manufacturing the first connection electrode 27 and second connection electrode 26 on the first substrate 80. FIGS. 4B, 5B, and 6B show the stages of manufacturing the first connection electrode 56 and second connection electrode 57 on the second substrate 81. FIGS. 7 and 8 shows how to bond the first connection electrodes 27, 56 to the second connection electrodes 26, 57. The previous stages of forming the first connection electrode 27 and second connection electrode 26 on the first substrate 80 and forming the first connection electrode 56 and second connection electrode 57 on the second substrate 81 are the same as those in a typical manufacturing method of a solid-state imaging device, so a description thereof will be omitted. The components corresponding to those in FIGS. 2 and 3 are denoted by the same reference numerals and symbols in FIGS. 4 to 8.

As shown in FIG. 4A, after the interlayer insulating film 18 covering the first interconnection layer M1 is formed on the first substrate 80, the first connection electrode 27 and second connection electrode 26 are formed from the second interconnection layer M2. The first connection electrode 27 is formed so as to be connected to the first connection wire 23 via the contact section 24, while the second connection electrode 26 is formed so as to be connected to the second connection wire 22 via the contact section 25.

As shown in FIG. 4B, similarly on the second substrate 81, after the interlayer insulating film 37 covering the second interconnection layer M2' is formed, the first connection electrode 56 and second connection electrode 57 are formed from the third interconnection layer M3'. The first connection electrode 56 is formed so as to be connected to the third connection wire 52 via the contact section 55, while the second connection electrode 57 is formed so as to be connected to the charge holding electrode 51 via the contact section 54.

In the present embodiment, the first connection electrodes 27, 56 and second connection electrodes 26, 57 are made of aluminum.

Then, as shown in FIG. 5A, on the first substrate 80, after the first connection electrode 27 and second connection electrode 26 are formed, an adhesive layer 18a is formed by applying an adhesive to the first connection electrode 27 and second connection electrode 26 to cover these electrodes 27, 26.

As shown in FIG. 5B, similarly on the second substrate 81, after the first connection electrode 56 and second connection electrode 57 are formed, an adhesive layer 37a is formed by applying an adhesive to the first connection electrode 56 and second connection electrode 57 to cover these electrodes 56, 57.

The adhesive layers 18a, 37a serve as the interlayer insulating films 18, 37.

Then, as shown in FIGS. 6A and 6B, the adhesive layers 18a, 37a are removed by oxygen plasma etching to expose the surfaces of the first connection electrodes 27, 56 and second connection electrodes 26, 57 on the first substrate 80 and second substrate 81. Then, the surfaces of the electrodes are activated by argon sputtering, for example, to form activated layers 18b, 37b.

Then, as shown in FIG. 7, the activated layer 18b of the first substrate 80 is pressure-bonded to the activated layer 37b of the second substrate 81. Since the activated surfaces of the electrodes are bonded by pressure to each other, the first substrate 80 and the second substrate 81 are integrated and the first connection electrode 27 is electrically bonded to the first connection electrode 56, and the second connection electrode 26 is electrically bonded to the second connection electrode 57.

Once bonded together in this manner, the first substrate 80 and the second substrate 81 are integrated and electrically connected to each other.

After the first substrate 80 and the second substrate 81 are connected to each other, the semiconductor substrate 12 on the light incident side of the first substrate 80 is etched to a suitable thickness to enable the photoelectric converter section PD to function (to absorb light), as shown in FIG. 8.

Then, the color filter 59, on-chip lens 60, and other components are formed in a predetermined order on the light incident side of the first substrate 80 as shown in FIG. 2, to complete the solid-state imaging device 1 in the present embodiment. The forming of the color filter 59, on-chip lens 60, and other components is carried out in a manufacturing process similar to that of a typical solid-state imaging device.

[1.4 Circuit Configuration of the Solid-State Imaging Device]

Figure 9:
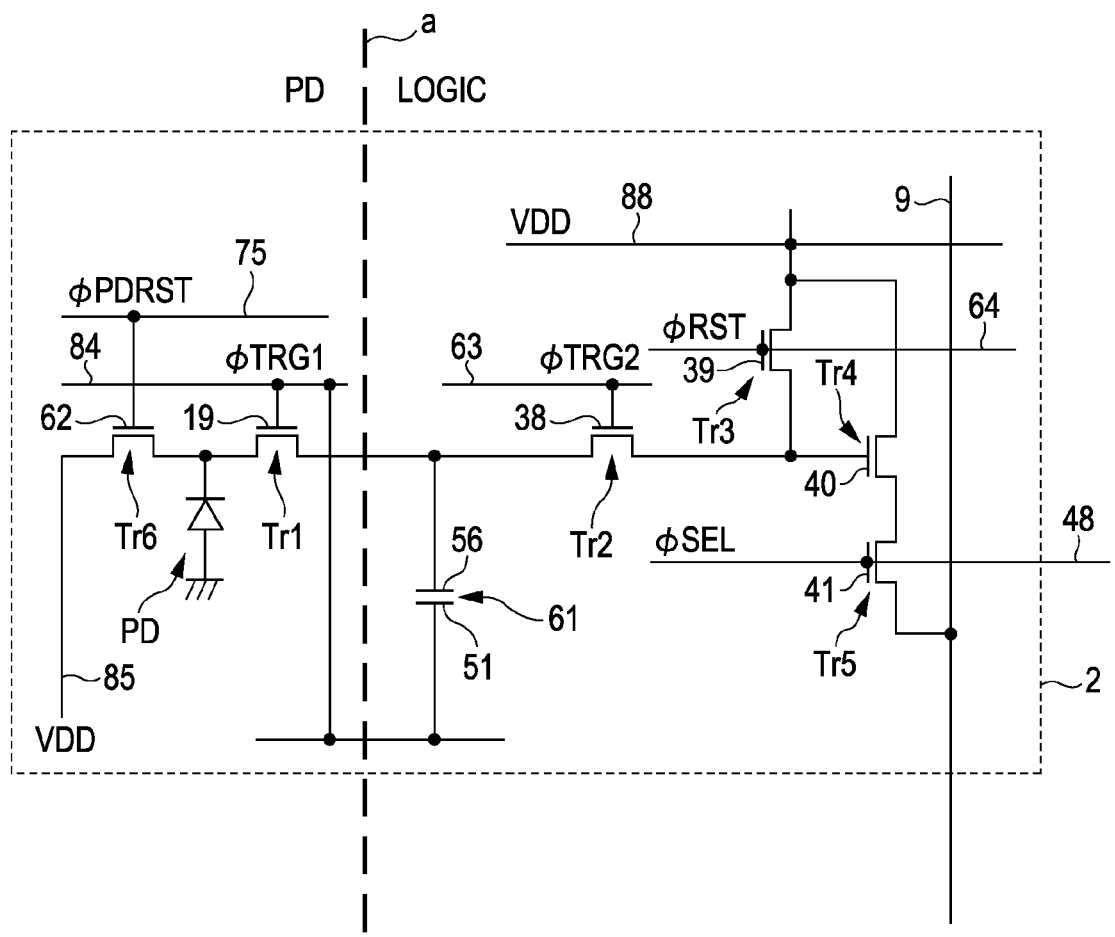
FIG. 9 is a circuit diagram of one pixel in the solid-state imaging device in the embodiment of the present invention.
Figure 10:
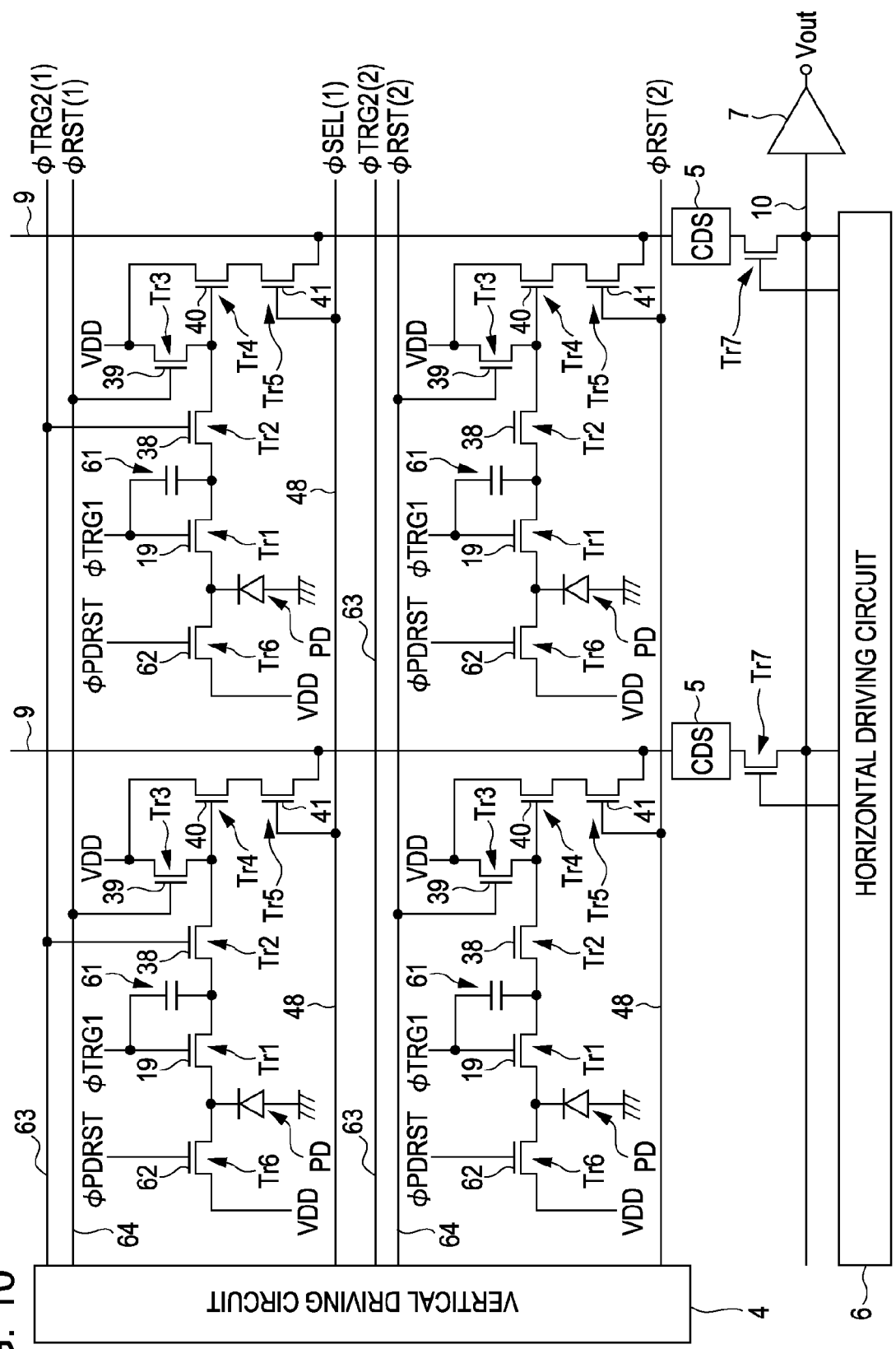
FIG. 10 is a circuit diagram of four adjacent pixels in two rows and two columns in the solid-state imaging device in the embodiment of the present invention.

Referring now to FIG. 9, a method of driving the solid-state imaging device 1 according to the above embodiment will be described. FIG. 9 shows the circuit configuration of one pixel in the solid-state imaging device 1 in the above embodiment. FIG. 10 shows the circuit configuration of four adjacent pixels located in two rows and two columns.

The line "a" in FIG. 9 indicates the plane at which the first connection electrode 27 and second connection electrode 26 formed on the first substrate 80 and the first connection electrode 56 and second connection electrode 57 formed on the second substrate 81 are connected to each other.

The anode side of the photodiode serving as the photoelectric converter section PD is grounded and its cathode side is connected to the source of the first transfer transistor Tr1. As shown in FIGS. 9 and 10 (not shown in FIG. 2), a reset transistor Tr6 for the photoelectric converter section PD is formed on the first substrate 80 and its drain is connected to the cathode side of the photoelectric converter section PD. A supply voltage wire 85 is connected to the source of the reset transistor Tr6 to apply a supply voltage VDD thereto. A reset wire 75 is connected to a gate electrode 62 of the reset transistor Tr6 to supply a reset pulse φPDRST thereto.

The drain of the first transfer transistor Tr1 is connected to the source of the second transfer transistor Tr2 via the first connection electrode 56 forming part of the charge accumulation capacitor section 61. A first transfer wire 84 supplied with a first transfer pulse φTRG1 is connected to the gate electrode 19 of the first transfer transistor Tr1. The first transfer wire 84 is connected to the charge holding electrode 51 forming part of the charge accumulation capacitor section 61.

The drain of the second transfer transistor Tr2 is connected to the source of the reset transistor Tr3 as well as to the gate electrode 40 of the amplification transistor Tr4. A second transfer wire 63 is connected to the gate electrode 38 of the second transfer transistor Tr2 to supply a second transfer pulse φTRG2 thereto.

A supply voltage wire 88 is connected to the drain of the reset transistor Tr3 to apply the supply voltage VDD thereto. A reset wire 64 is connected to the gate electrode 39 of the reset transistor Tr3 to supply a reset pulse φRST thereto.

The supply voltage wire 88 is connected to the source of the amplification transistor Tr4 to apply the supply voltage VDD thereto. The drain of the amplification transistor Tr4 is connected to the source of the selection transistor Tr5.

The selection wire 48 for supplying a selection pulse φSEL is connected to the gate electrode 41 of the selection transistor Tr5. The drain of the selection transistor Tr5 is connected to the vertical signal line 9.

As shown in FIG. 10, in the solid-state imaging device 1 in which the pixels 2 are arranged in a two-dimensional matrix, the second transfer wire 63, reset wire 64, and selection wire 48, which are common to each row, are connected to the gate electrodes 38, 39, 41. The second transfer pulse φTRG2, reset pulse φRST, and selection pulse φSEL are supplied from the vertical driving circuit 4 to the gate electrodes 38, 39, 41. Although not shown, the vertical driving circuit 4 also supplies the reset pulse φPDRST to the gate electrode 62 of the reset transistor Tr6 and the first transfer pulse φTRG1 to the gate electrode 19 of the first transfer transistor Tr1.

The vertical signal line 9 common to each column is connected to the drain of the selection transistor Tr5.

The vertical signal line 9 is followed by the column signal processing circuit 5 provided for each column. The column signal processing circuit 5 is followed by a horizontal transistor Tr7 to which the horizontal selection pulse from the horizontal driving circuit 6 is supplied.

[1.5 Method of Driving the Solid-State Imaging Device]

Figure 11:
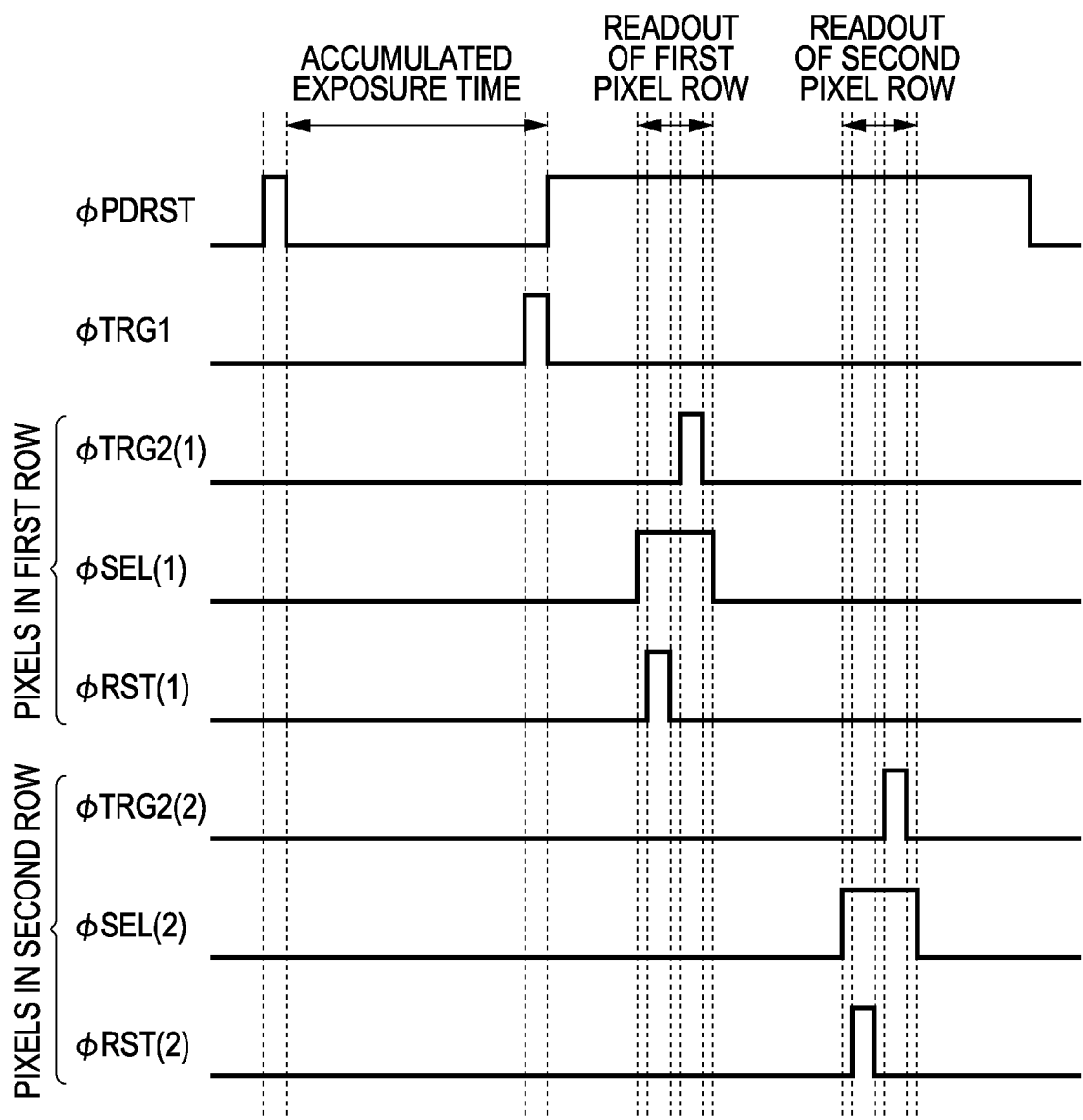
FIG. 11 is an exemplary timing chart showing a method of driving the solid-state imaging device according to the embodiment of the present invention.

Next, referring to the timing chart in FIG. 11 and the circuit configuration in FIG. 10, a method of driving the solid-state imaging device 1 having the above circuit configuration will be described.

First, the reset pulse φPDRST is set high to turn on the reset transistors Tr6 simultaneously in all pixels, in order to reset the photoelectric converter sections PD in all pixels to the same potential as the supply voltage VDD. With this operation, unnecessary charges accumulated in the photoelectric converter sections PD in all pixels are discharged and the photoelectric converter sections PD are reset to the same potential (VDD).

Next, the reset pulse φPDRST is set low to turn off the reset transistors Tr6 simultaneously in all pixels, in order to start the generation and accumulation of signal charges in the photoelectric converter sections PD in all pixels. The signal charges are generated according to the amount of incident light onto the photoelectric converter section PD and accumulated in a potential well created by the effect of the p-n junction in the photoelectric converter section PD. The charge accumulation capacitor section 61 is assumed empty at this moment because the signal charges accumulated in the charge accumulation capacitor section 61 were sequentially read out at the previous readout time. Alternatively, a timing for resetting the charge accumulation capacitor section 61 may be provided.

Then, the first transfer pulse φTRG1 is set high before a predetermined accumulation time has passed after the reset pulse φPDRST was set low, to turn on the first transfer transistors Tr1 simultaneously in all pixels in order to transfer the signal charges accumulated in the photoelectric converter sections PD to the impurity regions 16. The signal charges are then temporarily accumulated in the impurity region 16 formed on the first substrate 80, the impurity region 30, and the charge accumulation capacitor section 61 because the impurity region 16, impurity region 30, and charge accumulation capacitor section 61 are electrically connected. While the first transfer pulse φTRG1 is kept high, the signal charges are mainly accumulated in the charge accumulation capacitor section 61.

Then, the first transfer pulse φTRG1 is set low to turn off the first transfer transistors Tr1 in all pixels, in order to transfer the signal charges mainly accumulated in the charge accumulation capacitor section 61 to the depletion layers of the impurity regions 16 and 30. As shown in FIG. 11, the time period since the reset pulse φPDRST is set low until the first transfer pulse φTRG1 is set low constitutes an accumulated exposure time (electronic shutter time). When the first transfer pulse φTRG1 is set high to transfer the signal charges from the photoelectric converter section PD to the charge accumulation capacitor section 61, the first transfer pulse φTRG1 is set to a potential that enables the signal charges to be completely transferred from the photoelectric converter section PD.

Then, the reset pulse φPDRST is set high to turn on the reset transistors Tr6 in all pixels in order to reset the photoelectric converter sections PD. This prevents the signal charges accumulated in the photoelectric converter section PD in excess of its maximum charge accumulation amount from overflowing to the charge accumulation capacitor section 61 during the readout of the signal charges accumulated in the charge accumulation capacitor section 61. Alternatively, the photoelectric converter section PD may be reset to the same potential as the supply voltage VDD in preparation for the next accumulation of signal charges. During accumulation of signal charges in the charge accumulation capacitor section 61 or the impurity region 16, 30, a potential may be applied as the potential of the first transfer pulse φTRG1 to form an inversion layer on the surface of the charge accumulation capacitor section 61. This can suppress the generation of dark current during the accumulation of signal charges.

Then, the selection pulse φSEL(1) is set high to turn on the selection transistors Tr5 in the first row in order to select the pixels 2 in the first row. With the first row selection pulse φSEL(1) kept high, the reset pulse φRST(1) is set high to turn on the reset transistors Tr3 in the first row. With this, the potential of the impurity region 31 serving as the floating diffusion region connected to the gate electrode 40 of the amplification transistor Tr4 is reset to the same potential as that of the supply voltage VDD. The reset-time output from the amplification transistor Tr4 is stored in the column signal processing circuit 5 through the vertical signal line 9.

Then, the second transfer pulse φTRG2(1) is set high to turn on the second transfer transistors Tr2 in the pixels 2 in the first row in order to transfer the signal charges from the impurity regions 30 and 16 in the pixels 2 in the first row to the impurity regions 31 serving as the floating diffusion regions. For this purpose, the second transfer pulse φTRG2(1) is set to a potential that enables the signal charges to be completely transferred from the impurity regions 30 and 16 to the impurity region 31. As the signal charges are read out to the impurity region 31, the potential of the impurity region 31 serving as the floating diffusion region changes and a signal voltage corresponding to this change is applied to the gate electrode 40 of the amplification transistor Tr4. The signal voltage amplified by the amplification transistor Tr4 is output to the vertical signal line 9.

The signal voltage output to the vertical signal line 9 is sent to the column signal processing circuit 5. The column signal processing circuit 5 outputs as the pixel signal from the pixel 2 in the first row the difference between the reset-time output stored beforehand and the amplified signal voltage. As the horizontal driving circuit 6 sequentially turns on the horizontal transistors Tr7, the pixel signals from the pixels 2 in the first row are serially output from the output terminal Vout through the output circuit 7.

Then, after the selection pulse φSEL(1) is set low, the selection pulse φSEL(2) is set high to turn on the selection transistors Tr5 in the second row to select the pixels 2 in the second row. With the second row selection pulse φSEL(2) kept high, the second transfer pulse φTRG2(2) and the reset pulse φRST(2) are activated as with the second transfer pulse φTRG2(1) and the reset pulse φRST(1) for the first row. With this, the second row pixels 2 are read in the same way as in the first row described above.

As is understood from the above description, in the solid-state imaging device 1 in the present embodiment, the accumulated exposure time for generating and accumulating signal charges in the photoelectric converter section PD takes place simultaneously in all pixels. The signal charges accumulated at the same time in all pixels is accumulated and held in the charge accumulation capacitor section 61, then read out to the impurity region 31 in the order of lines (rows), amplified according to the potential of the signal charges, and output through the vertical signal line 9.

The solid-state imaging device 1 according to the present embodiment, which has a circuit configuration not much changed from that of a typical solid-state imaging device equipped with the global shutter function in the past except that the photoelectric converter section PD and the circuitry section are formed on different substrates, can provide an enlarged opening area of the photoelectric converter section PD. In the present embodiment, since the entire effective area of the light receiving surface of the first substrate 80 can be used as the photoelectric converter section PD, a wide area can be reserved for the photoelectric converter section PD and the opening area can be enlarged accordingly. This improves the photosensitivity.

The photoelectric converter section PD on the first substrate 80 and the MOS transistors on the second substrate 81 are formed in separate processes even in a typical method of manufacturing the solid-state imaging device 1 in the past. The total number of steps of forming the first substrate 80 and the second substrate 81 in the present embodiment is, therefore, close to the number of steps of the typical solid-state imaging device manufacturing method in the past, except for the steps sharable when all components are formed on a single substrate. In other words, the number of manufacturing steps for forming respective components on the first substrate 80 and second substrate 81 of the solid-state imaging device 1 in the present embodiment does not differ much from that for forming all components on a single substrate of the typical solid-state imaging device as in the past. In the solid-state imaging device 1 in the present embodiment, the size of each substrate can be reduced because the first substrate 80 on which the photoelectric converter section PD is formed and the second substrate 81 on which the charge accumulation capacitor section 61 and the MOS transistors are formed are separately formed. It is possible accordingly to reduce in size the chip on which the solid-state imaging device 1 is formed and thus increase the number of chips obtainable from a single wafer.

In the present embodiment, the cost of a chip can theoretically be reduced because an increased number of chips can be obtained from a single wafer, while the number of manufacturing steps is unchanged.

In the solid-state imaging device 1 in the present embodiment, the entire circuitry for driving the MOS transistors can be formed on the second substrate 81 without being complicated because the first substrate 80 and the second substrate 81 are electrically connected to each other.

In the solid-state imaging device 1 in the present embodiment, electronic shutter operation (global shutter operation) can take place simultaneously in all pixels because the charge accumulation capacitor section 61 is provided in each pixel 2. The maximum photosensitivity can be achieved with a small light receiving area by making the maximum use of the light receiving area of the photoelectric converter section PD, because the charge accumulation capacitor section 61 and the photoelectric converter section PD are vertically stacked. Since a device having the same performance as a typical solid-state imaging device in the past can be realized in a much smaller area, it is possible to reduce the cost of a chip and obtain a solid-state imaging device that can downsize video apparatuses and other electronic apparatuses.

2. Another Embodiment

Solid-State Imaging Device

Figure 12:
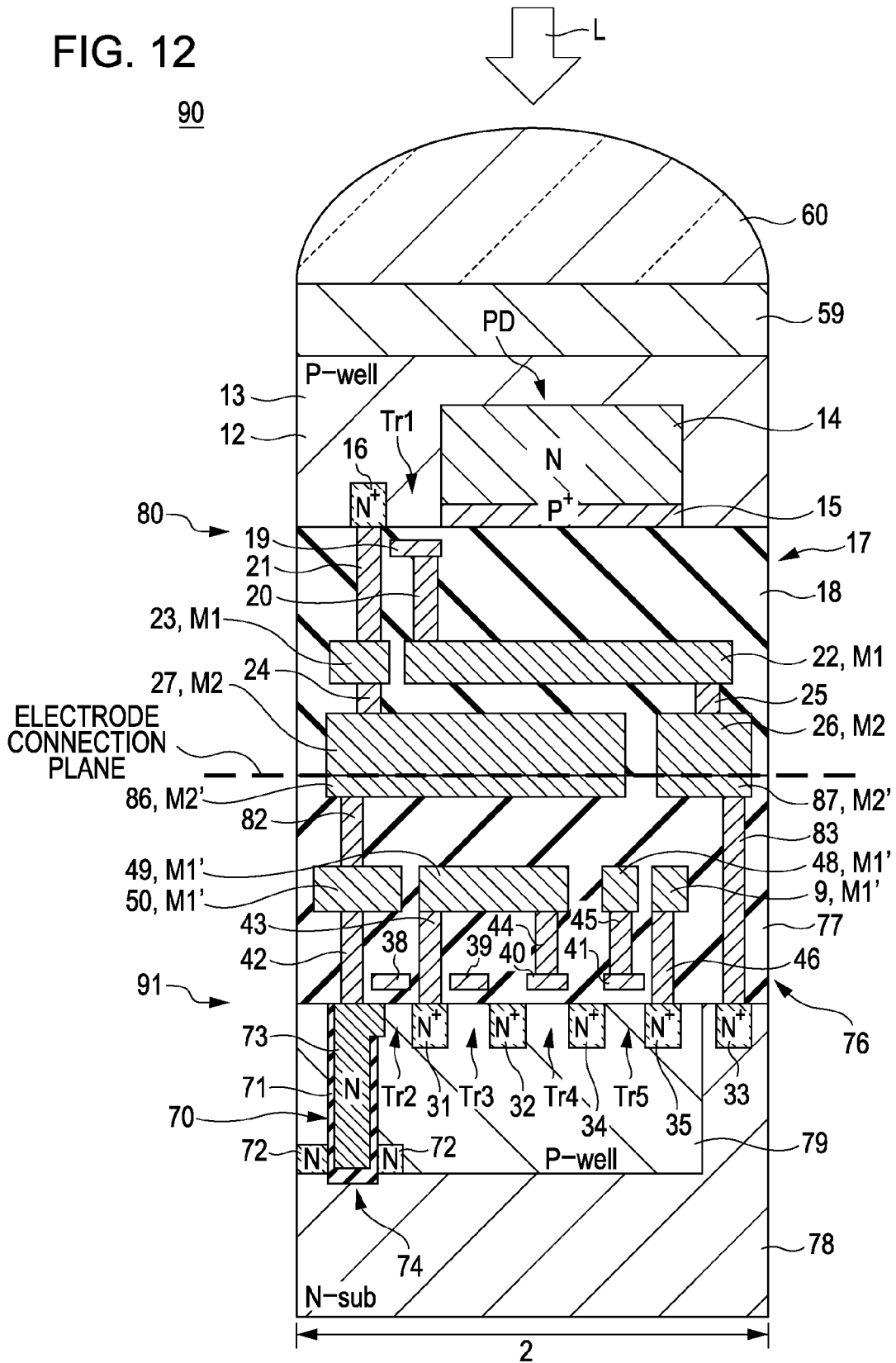
FIG. 12 schematically shows the cross section of a solid-state imaging device according to another embodiment of the present invention.

A solid-state imaging device according to another embodiment of the present invention will be described below. FIG. 12 schematically shows the entire structure of a solid-state imaging device 90 according to the other embodiment of the present invention.

The solid-state imaging device 90 in the present embodiment has a charge accumulation capacitor section different in structure from the solid-state imaging device 1 in the embodiment described earlier. The entire structure of the solid-state imaging device 90 in the present embodiment is the same as that shown in FIG. 1, so a repetitious description thereof will be omitted. The components corresponding to those in FIG. 2 are denoted by the same reference numerals and symbols in FIG. 12 and a repetitious description thereof will be omitted.

As shown in FIG. 12, a second substrate 91 in the present embodiment has a semiconductor substrate 78 on which desired impurity regions 31, 32, 33, 34, 35 and an embedded type charge accumulation capacitor section 74 are formed and a multilayered interconnection layer 76 in which desired wires and electrodes are formed. A plurality of MOS transistors formed on the second substrate 91 includes the second transfer transistor Tr2, the reset transistor Tr3, the amplification transistor Tr4, and the selection transistor Tr5.

The semiconductor substrate 78 is formed from an n-type silicon substrate, and a p-type well layer 79 is formed in the upper area of the semiconductor substrate 78 in which the MOS transistors and charge accumulation capacitor section 74 are formed. The p-type well layer 79 can be formed by implanting p-type dopants into the semiconductor substrate 78.

The impurity regions 31, 32, 34, 35 forming part of the second transfer transistor Tr2, reset transistor Tr3, amplification transistor Tr4, and selection transistor Tr5 are formed in desired areas on the top side of the p-type well layer. The impurity regions 31, 32, 34, 35 are formed by implanting n-type dopants at a high concentration into desired areas of the p-type well layer 79.

The impurity region 31 is shared by the drain of the second transfer transistor Tr2 and the source of the reset transistor Tr3 as the floating diffusion region to which the signal charges are read out. The impurity region 32 is shared by the drain of the reset transistor Tr3 and the source of the amplification transistor Tr4. The impurity region 34 is shared by the drain of the amplification transistor Tr4 and the source of the selection transistor Tr5. The impurity region 35 is used as the drain of the selection transistor Tr5.

The charge accumulation capacitor section 74 includes a first electrode layer 72 formed in a groove 70 of the semiconductor substrate 78, a dielectric layer 71, and a second electrode layer 73. Thus, the charge accumulation capacitor section 74 in the present embodiment constitutes a trench capacitor.

The groove 70 is an opening which is formed in the surface of the p-type well layer 79 and has a depth reaching the n region of the semiconductor substrate 78. The first electrode layer 72 includes an n-type impurity region which is formed in an area surrounding the periphery of the bottom of the groove 70, adjacent to the n region of the semiconductor substrate 78. The first electrode layer 72 is formed by implanting n-type dopants into the interface between the p-type well layer 79 and the n region constituting the semiconductor substrate 78. The dielectric layer 71 is formed from the silicon oxide film formed in the inner surface of the groove 70. The second electrode layer 73 is formed from the polycrystalline silicon filling the groove 70 with the dielectric layer 71 in between. The polycrystalline silicon constituting the second electrode layer 73 is preferably doped with an n-type impurity. The second electrode layer 73 forming part of the charge accumulation capacitor section 74 is formed so as to be connected to the region serving as the channel section of the second transfer transistor Tr2 formed between the charge accumulation capacitor section 74 and the impurity region 31 on the top side of the semiconductor substrate 78.

In the present embodiment, the impurity region 33 is formed by implanting n-type dopants at a high concentration into the surface of the semiconductor substrate 78 other than the region where the p-type well layer 79 is formed. The impurity region 33 and the first electrode layer 72 are configured so as to be electrically connected to each other by the n region having the same potential on the semiconductor substrate 78.

The second electrode layer 73 in the charge accumulation capacitor section 74 thus structured serves as the source of the second transfer transistor Tr2. The regions of the p-type well layer 79 between the charge accumulation capacitor section 74 and the impurity regions 31, 32, 34, 35 serve as the channel sections of the MOS transistors.

The multilayered interconnection layer 76 is formed above the semiconductor substrate 78. In the multilayered interconnection layer 76, the gate electrodes 38, 39, 40, 41 forming part of the MOS transistors, the first interconnection layer M1', and the second interconnection layer M2' are stacked with an interlayer insulating film 77 in between.

The gate electrodes 38, 39, 40, 41 are formed above the channel sections with a gate insulating film (not shown) in between. The gate electrode 38 formed above the p-type well layer 79 between the charge accumulation capacitor section 74 and the impurity region 31 serves as the gate electrode of the second transfer transistor Tr2. The gate electrode 39 formed above the p-type well layer 79 between the impurity region 31 and the impurity region 32 serves as the gate electrode of the reset transistor Tr3. The gate electrode 40 formed above the p-type well layer 79 between the impurity region 32 and the impurity region 34 serves as the gate electrode of the amplification transistor Tr4. The gate electrode 41 formed above the p-type well layer 79 between the impurity region 34 and the impurity region 35 serves as the gate electrode of the selection transistor Tr5.

The first interconnection layer M1' includes the first connection wire 50, the second connection wire 49, the selection wire 48, and the vertical signal line 9. The first connection wire 50 is connected to the second electrode layer 73 serving as the source of the second transfer transistor Tr2, via the contact section 42 formed in the interlayer insulating film 77. The second connection wire 49 is connected to the impurity region 31 and the gate electrode 40 of the amplification transistor Tr4, via the contact sections 43, 44 formed in the interlayer insulating film 77. The impurity region 31 serving as the floating diffusion region and the gate electrode 40 of the amplification transistor Tr4 are thus electrically connected to each other by the second connection wire 49. The selection wire 48 is connected to the gate electrode 41 of the selection transistor Tr5, via the contact section 45 formed in the interlayer insulating film 77. The selection wire 48 supplies selection pulses to the gate electrode 41 of the selection transistor Tr5. The vertical signal line 9 is connected to the impurity region 35 serving as the drain of the selection transistor Tr5, via the contact section 46 formed in the interlayer insulating film 77.

The second interconnection layer M2' includes a first connection electrode 86 and a second connection electrode 87 which are exposed on the surface of the multilayered interconnection layer 76. The first connection electrode 86 is connected to the first connection wire 50 formed from the first interconnection layer M1', via a contact section 82 formed in the interlayer insulating film 77. The second connection electrode 87 is connected to the impurity region 33 formed in the n region forming part of the semiconductor substrate 78, via a contact section 83 formed in the interlayer insulating film 77. A first transfer wire (not shown), which is formed in the multilayered interconnection layer 76 on the second substrate 91, is connected to the second connection electrode 87 to supply a first transfer pulse to the gate electrode 19 of the first transfer transistor Tr1 and the impurity region 33.

A second transfer wire (not shown in FIG. 12) is connected to the gate electrodes 38 of the second transfer transistor Tr2 to supply a second transfer pulse thereto. A reset wire is connected to the gate electrode 39 of the reset transistor Tr3 to supply a reset pulse thereto. The second transfer wire and the reset wire are formed from desired interconnection layers in the multilayered interconnection layer.

In the solid-state imaging device 90 in the present embodiment, the first substrate 80 is placed on the second substrate 91, so that the first connection electrodes 27, 86 and the second connection electrodes 26, 87 of the first substrate 80 and second substrate 91 are connected to each other.

In the solid-state imaging device 90 in the present embodiment, the first substrate 80 and the second substrate 91 are bonded together in the same manner as in the solid-state imaging device 1 in the embodiment described earlier. The solid-state imaging device 90 in the present embodiment has a similar circuit configuration to that in the solid-state imaging device 1 in the embodiment described earlier.

In the solid-state imaging device 90 in the present embodiment, the first transfer pulse to be supplied to the gate electrode 19 of the first transfer transistor Tr1 is set high to turn on the first transfer transistor Tr1 in order to transfer the signal charges from the photoelectric converter section PD to the impurity region 16. The signal charges are temporarily held by the impurity region 16 on the first substrate 80 and the charge accumulation capacitor section 74 formed on the second substrate 91, because the first electrode layer 72 of the second substrate 91 is supplied with the same potential as that of the gate electrode 19. The signal charges are mainly accumulated in the charge accumulation capacitor section 74. Then, the signal charges are transferred pixel by pixel to the impurity region 31 serving as the floating diffusion region and read out pixel by pixel. This driving method is similar to that of the solid-state imaging device 1 in the embodiment described earlier.

With the charge accumulation capacitor section 74 formed in the groove 70 on the semiconductor substrate 78, the solid-state imaging device 90 in the present embodiment can reduce the number of interconnection layers forming the charge accumulation capacitor section and provide a similar effect as with the solid-state imaging device 1 in the embodiment described earlier.

The charge accumulation capacitor section may be formed on the first substrate, although it is formed on the second substrate in the above embodiments. To enlarge the light receiving area, it is preferable to form the charge accumulation capacitor section on the first substrate.

The above embodiments are described with reference to the CMOS solid-state imaging devices in which unit pixels for sensing signal charges corresponding to the amount of incident light as the physical quantity are arranged in an array. It should be appreciated, however, that embodiments of the present invention are not limited to the CMOS solid-state imaging device. It should also be appreciated that these embodiments are not limited to the column-system solid-state imaging device in general in which a column circuit is provided for each column of pixels in the pixel section having pixels arranged in a two-dimensional matrix.

Embodiments of the present invention are not limited to the solid-state imaging device that senses and captures the incident visible light amount distribution as an image, but also applicable to the solid-state imaging device that captures the amount distribution of incident infrared ray, X-ray, and particles as an image. In a broad sense, embodiments of the present invention are applicable to fingerprint detecting sensors and other solid-state imaging devices (physical quantity distribution detectors) in general which detect and capture pressure, capacitance, and other physical quantities as an image.

It should be appreciated that embodiments of the present invention are not limited to the solid-state imaging device that reads out a pixel signal from each unit pixel by scanning the unit pixels in a pixel section row by row. These embodiments are also applicable to an X-Y address type solid-state imaging device that reads a signal from any pixel by performing pixel-by-pixel selection.

The solid-state imaging device may be formed on a chip or in a module having an imaging function with a pixel section and a signal processing section or an optical system packaged in a single unit.

It should be appreciated that embodiments of the present invention are not limited to the solid-state imaging device, but is also applicable in imaging apparatuses. Examples of imaging apparatuses include digital still cameras, video cameras, and other camera systems, as well as potable telephones and other electronic apparatuses equipped with an imaging function. The imaging apparatus may be embodied in a modular form to be installed in an electronic apparatus, that is, in the form of a camera module.

3. Still Another Embodiment

Electronic Apparatus

Figure 13:
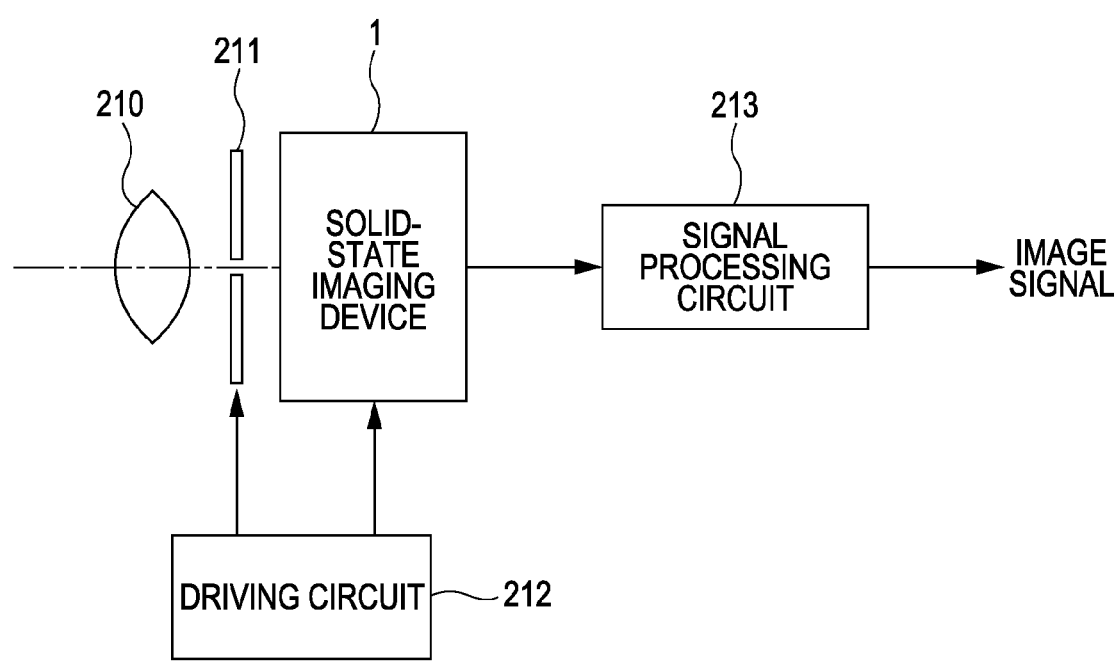
FIG. 13 schematically shows an electronic apparatus according to still another embodiment of the present invention.

An electronic apparatus according to still another embodiment of the present invention will now be described. FIG. 13 schematically shows the structure of an electronic apparatus 200 according to the embodiment of the present invention.

The electronic apparatus 200 in the present embodiment illustrates an embodiment in which the solid-state imaging device 1 in the embodiment of the present invention described first is employed in an electronic apparatus (camera).

FIG. 13 shows the cross section of the electronic apparatus 200 according to the present embodiment. The electronic apparatus 200 according to the present embodiment illustrates a digital camera capable of still image shooting.

The electronic apparatus 200 according to the present embodiment has the solid-state imaging device 1, an optical lens 210, a shutter device 211, a driving circuit 212, and a signal processing circuit 213.

The optical lens 210 focuses the image light (incident light) from a subject on the imaging area of the solid-state imaging device 1. With this, signal charges are accumulated in the solid-state imaging device 1 for a certain period of time.

The shutter device 211 controls the period of exposure to light and the light shielding period in the solid-state imaging device 1.

The driving circuit 212 supplies a driving signal for controlling the transfer operation of the solid-state imaging device 1 and the shuttering operation of the shutter device 211. In response to the driving signal (timing signal) from the driving circuit 212, the solid-state imaging device 1 transfers signals. The signal processing circuit 213 carries out various types of signal processing. The processed video signal is stored in a memory or other storage medium, or output to a monitor.

The electronic apparatus 200 in the present embodiment can be downsized because the solid-state imaging device 1 can be miniaturized. The manufacturing cost of the electronic apparatus 200 can be reduced because the solid-state imaging device 1 can be formed at a reduced cost.

The electronic apparatus 200 to which the solid-state imaging device 1 is applicable is not limited to a camera, but is also applicable to a digital still camera and an imaging apparatus such as a camera module for use with a mobile telephone or other mobile apparatus.

Although the solid-state imaging device 1 is used in an electronic apparatus in the present embodiment, the solid-state imaging device 90 in the embodiment described earlier may be employed instead.

The present application contains subject matter related to that disclosed in Japanese Priority Patent Application JP 2009-064956 filed in the Japan Patent Office on Mar. 17, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
first and second substrates;
a plurality of pixels, each pixel of the plurality of pixels including:
  a first multilayered interconnection layer of the first substrate, the first multilayered interconnection layer comprising a plurality of interconnection layers;
  a second multilayered interconnection layer of the second substrate, the second multilayered interconnection layer comprising a plurality of interconnection layers;
  a photoelectric converter section on the first substrate to generate and accumulate signal charges corresponding to incident light;
  a charge accumulation capacitor section comprising two interconnection layers with a dielectric layer in between;
  a first transfer transistor for transferring the signal charges generated by the photoelectric converter section to the charge accumulation capacitor section, the charge accumulation capacitor section temporarily holding the signal charges transferred from the photoelectric converter section;
  a plurality of MOS transistors on the second substrate, the plurality of MOS transistors on the second substrate including a second transfer transistor for transferring the signal charges held in the charge accumulation capacitor section;

a first connection electrode of the first multilayered interconnection layer physically connected to a first connection electrode of the second multilayered interconnection layer; and
a second connection electrode of the first multilayered interconnection layer physically connected to a second connection electrode of the second multilayered interconnection layer,
wherein the first multilayered interconnection layer or the second multilayered interconnection layer includes the charge accumulation capacitor section and wherein at least a portion of the charge accumulation capacitor section is between a plurality of interconnection layers of the first substrate and a plurality of interconnection layers of the second substrate.

2. The solid-state imaging device according to claim 1, wherein the first and second connection electrodes of the first substrate and the first and second connection electrodes of the second substrate are electrically connected to each other by bonding the first substrate and the second substrate to each other with the first substrate being on a light incident side of the solid-state imaging device.

3. The solid-state imaging device according to claim 2, wherein the second transfer transistor for transferring the signal charges held in the charge accumulation capacitor section transfers the signal charges to a floating diffusion region; and a drain of the first transfer transistor, the charge accumulation capacitor section, and a source of the second transfer transistor are electrically connected.

4. The solid-state imaging device according to claim 1, wherein the first and second connection electrodes of the second substrate serve as a light shielding film for shielding a region serving as a source of the second transfer transistor from light.

5. The solid-state imaging device according to claim 1, wherein the first multilayered interconnection layer includes the charge accumulation capacitor section.

6. The solid-state imaging device according to claim 1, wherein the second multilayered interconnection layer includes the charge accumulation capacitor section.

7. An electronic apparatus comprising:
an optical lens;
a solid-state imaging device comprising:
 first and second substrates;
 a plurality of pixels, each pixel of the plurality of pixels including:
  a first multilayered interconnection layer of the first substrate, the first multilayered interconnection layer comprising a plurality of interconnection layers;
  a second multilayered interconnection layer of the second substrate, the second multilayered interconnection layer comprising a plurality of interconnection layers;
  a photoelectric converter section on the first substrate for generating and accumulating signal charges corresponding to incident light;
  a charge accumulation capacitor section comprising two interconnection layers with a dielectric layer in between;
  a first transfer transistor for transferring the signal charges generated by the photoelectric converter section to the charge accumulation capacitor section, the charge accumulation capacitor section accumulating the signal charges transferred from the photoelectric converter section;
  a plurality of MOS transistors on the second substrate and including a second transfer transistor for transferring the signal charges held in the charge accumulation capacitor section;
  a first connection electrode of the first multilayered interconnection layer physically connected to a first connection electrode of the second multilayered interconnection layer; and
  a second connection electrode of the first multilayered interconnection layer physically connected to a second connection electrode of the second multilayered interconnection layer, wherein the first multilayered interconnection layer or the second multilayered interconnection layer includes the charge accumulation capacitor section and wherein at least a portion of the charge accumulation capacitor section is between a plurality of interconnection layers of the first substrate and a plurality of interconnection layers of the second substrate; and
 a signal processing circuit for processing signals output from the solid-state imaging device.

8. The electronic apparatus according to claim 7, wherein the first and second connection electrodes of the first substrate and the first and second connection electrodes of the second substrate are electrically connected to each other by bonding the first substrate and the second substrate to each other with the first substrate being on a light incident side of the solid-state imaging device.

9. The electronic apparatus according to claim 8, wherein the second transfer transistor for transferring the signal charges held in the charge accumulation capacitor section transfers the signal charges to a floating diffusion region; and a drain of the first transfer transistor, the charge accumulation capacitor section, and a source of the second transfer transistor are electrically connected.

10. The electronic apparatus according to claim 7, wherein the first and second connection electrodes of the second substrate serve as a light shielding film for shielding a region serving as a source of the second transfer transistor from light.

11. The electronic apparatus according to claim 7, wherein the first multilayered interconnection layer includes the charge accumulation capacitor section.

12. The electronic apparatus according to claim 7, wherein the second multilayered interconnection layer includes the charge accumulation capacitor section.

* * * * *